(12) United States Patent
Terracciano et al.

(10) Patent No.: US 11,460,399 B2
(45) Date of Patent: Oct. 4, 2022

(54) SPECTRALLY SELECTIVE PYROELECTRIC DETECTION DEVICE AND ASSOCIATED METHOD OF USE

(71) Applicant: University of Central Florida Research Foundation, Inc., Orlando, FL (US)

(72) Inventors: Anthony Terracciano, Orlando, FL (US); Robert Peale, Orlando, FL (US); Christopher Arose, Orlando, FL (US); Subith Vasu, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 17/228,801

(22) Filed: Apr. 13, 2021

(65) Prior Publication Data

US 2021/0318235 A1    Oct. 14, 2021

Related U.S. Application Data

(60) Provisional application No. 63/008,853, filed on Apr. 13, 2020.

(51) Int. Cl.
*G01N 21/3581* (2014.01)
*G01J 5/34* (2022.01)
*H01L 37/02* (2006.01)

(52) U.S. Cl.
CPC ............ *G01N 21/3581* (2013.01); *G01J 5/34* (2013.01); *H01L 37/025* (2013.01); *G01J 2005/345* (2013.01)

(58) Field of Classification Search
CPC .. G01N 21/3581; G01J 5/34; G01J 2005/345; G01J 3/10; G01J 3/42; H01L 37/025; H01L 37/02
See application file for complete search history.

(56) References Cited

U.S. PATENT DOCUMENTS

| | | | |
|---|---|---|---|
| 10,422,699 B1 * | 9/2019 | Vella | G01J 5/34 |
| 2007/0195921 A1 * | 8/2007 | Ouchi | G01N 22/00 |
| | | | 378/1 |

FOREIGN PATENT DOCUMENTS

| | | | | |
|---|---|---|---|---|
| CN | 206725102 U | * | 12/2017 | |
| CN | 108831988 A | * | 11/2018 | H01L 37/02 |

(Continued)

OTHER PUBLICATIONS

Translation of CN-206725102-U (Year: 2017).*

(Continued)

*Primary Examiner* — David P Porta
*Assistant Examiner* — Mamadou Faye
(74) *Attorney, Agent, or Firm* — Molly L. Sauter; Smith & Hopen, P.A.

(57) ABSTRACT

A method and device which can receive and identify electromagnetic radiation in the terahertz (THz) frequency range. The device has a combination of material and geometric parameters that are unique and tunable, enabling resonating frequencies for spectral selectivity in the THz range (0.1-15) with ultra-narrow channel widths (0.01-0.10 THz) full width at half maximum (FWHM). Dependent upon configuration, the device may be employed as a large area resonator to collect weak or diffuse signals or as a constituent of an array able to take pictures within the spectrum for which they are sensitive.

18 Claims, 18 Drawing Sheets

(56) References Cited

FOREIGN PATENT DOCUMENTS

| WO | WO-2013112608 A1 | * | 8/2013 | ............... G01J 3/108 |
| WO | WO-2016196309 A2 | * | 12/2016 | ......... A61B 1/00188 |
| WO | WO-2020222149 A1 | * | 11/2020 | |

OTHER PUBLICATIONS

Georgiou et al. "Active loaded plasmonic antennas at terahertz frequencies: Optical control of their capacitive-inductive coupling", American Physical Society, 2015, p. 125443-1-125443-7. (Year: 2015).*

John et al. "Very Black Infrared Detector for Vertically Aligned Carbon Nanotubes and Electric-Field Poling of Lithium Tantalate", pubs.acs.org/NanoLett, 2010, p. 3261-3266. (Year: 2010).*

Shao et al. "Pyroelectric detectors based on high-performance PMN-PT crystals", AMA Conferences 2013-SENSOR 2013, OPTO 2013, IRS2 2013, p. 89-94 (Year: 2013).*

Translation of CN-108831988-A (Year: 2018).*

Suen, J. Y. et al., Multifunctional metamaterial pyroelectric infrared detectors, Optica, vol. 4, No. 2, pp. 276-279, Feb. 2017.

* cited by examiner

Amide

|  | False | True |  |
|---|---|---|---|
| False | 52 | 1 | 92% |
| True | 4 | 6 |  |

Benzene Only

|  | False | True |  |
|---|---|---|---|
| False | 26 | 4 | 89% |
| True | 3 | 30 |  |

Aniline+Benzene

|  | False | True |  |
|---|---|---|---|
| False | 59 | 0 | 97% |
| True | 2 | 2 |  |

Piperidine

|  | False | True |  |
|---|---|---|---|
| False | 55 | 2 | 97% |
| True | 0 | 2 |  |

Aniline Only

|  | False | True |  |
|---|---|---|---|
| False | 44 | 5 | 90% |
| True | 1 | 13 |  |

*FIG. 25*

SPECTRALLY SELECTIVE PYROELECTRIC DETECTION DEVICE AND ASSOCIATED METHOD OF USE

CROSS-REFERENCE TO RELATED APPLICATIONS

This application claims priority to U.S. Provisional Patent Application No. 63/008,853 filed on Apr. 13, 2020, the entirety of which is incorporated herein by reference.

FEDERALLY SPONSORED RESEARCH OR DEVELOPMENT

This invention was made with Government support under Grant No. D18AP00040 awarded by the Defense Advanced Research Projects Agency (DARPA). The government has certain rights in the invention.

BACKGROUND OF THE INVENTION

This invention relates, generally, to pyroelectric detectors. More specifically, it relates to detectors using a pyroelectric detective device capable of detecting electromagnetic radiation in the terahertz (THz) range.

Electromagnetic radiation detectors have existed and are designed specifically to detect certain wavelengths. For example, there exist detectors adapted to intercept electromagnetic radiation in the mid-wave and long-wave infrared spectral regions. Those devices, however, are designed for the infrared spectral regions and the described geometries are not adaptable to terahertz wavelengths.

Additionally, other alternative detectors require multiple optical components to achieve similar parameters, with lower effectiveness. Two alternatives are bolometers, that require liquid helium cooling to achieve similar performance characteristics, and hydrogen isotope enriched deuterated triglycine sulfate detectors paired with a spectrometer to provide wavelength/frequency selectivity.

Terahertz detectors are particularly useful in detecting objects with specific optical qualities within the terahertz range of wavelengths. One such example is the extremely dangerous narcotic, fentanyl. Fentanyl is a powerful opioid and norepinephrine inhibitor that binds to μ-opioid receptors in the body. At the moment, there are several fentanyl analogs and derivates that exist and bind to $\mu$, $\delta$, or, $\kappa$ opioid receptors. Metabolism of fentanyl primarily takes place through liver and intestinal CYP3A4 N-oxidative dealkylation. This process also includes several additional metabolization steps before being excreted from the body through the urine.

Fentanyl is a dangerous narcotic that enters the body through multiple methods, including dermal, inhalation, and injection. The danger of this narcotic has been illustrated in rat studies. The data shows that, in rats, the lethal dose ($LD_{50}$) of fentanyl is 3.1 mg/kg, an eighth of the $LD_{50}$ for heroin. In addition, carfentanil, a synthetic opioid, and analog of fentanyl, has a 100 times higher effective dose ($ED_{50}$) and lower $LD_{50}$ than fentanyl, making it substantially more dangerous when misused.

The lethality of fentanyl and related compounds has resulted in a sharp increase in the number of deaths resulting from illicit drug use. In addition, fentanyl-related incidents have become increasingly more problematic for first responders arriving at an opioid-related event as fentanyl uptake through inhalation is frequently being reported.

To combat the rise in fentanyl-related deaths and curb the importation of fentanyl from countries around the world, police, federal officers, paramedics, and others must have a safe and reliable device and method for detecting illicit drugs—such as fentanyl. Such a detector must be contact free to keep personnel safe, simple to operate and interpret results with minimal training, capable of providing results in seconds, accurate to prevent false positives, and able to detect fentanyl and its derivatives.

Accordingly, what is needed is a device and method adapted to detect objects with specific optical quality within the terahertz wavelength, including but not limited to the illicit drug fentanyl, that is quick, safe, accurate, and effective. However, in view of the art considered as a whole at the time the present invention was made, it was not obvious to those of ordinary skill in the field of this invention how the shortcomings of the prior art could be overcome.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

While certain aspects of conventional technologies have been discussed to facilitate disclosure of the invention, Applicants in no way disclaim these technical aspects, and it is contemplated that the claimed invention may encompass one or more of the conventional technical aspects discussed herein.

The present invention may address one or more of the problems and deficiencies of the prior art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

SUMMARY OF THE INVENTION

In various embodiments, the pyroelectric detection device of the present invention has a combination of material and geometric parameters that are unique and tunable, enabling resonating frequencies (spectral selectivity) in the THz range (0.1-15) with ultra-narrow channel widths (0.01-0.10 THz) full width half max (FWHM) and minor secondary absorption bands. Dependent upon configuration, the device may either act as a large area resonator to collect weak/diffuse signals or as a constituent of an array able to capture pictures within the spectrum for which they are sensitive.

Various embodiments include plasmonic near-perfect absorbers, comprised of metal films with a periodic array of subwavelength openings deposited on the surface of pyroelectric materials to create wavelength-selective far-infrared detectors. Similar work has focused on detectors for mid-wave and long-wave infrared spectral regions, but none for far-infrared. The present invention focuses on wavelengths beyond 20 μm, which was motivated by a long felt need for specific aerospace, security, and contraband sensing applications.

In a particular embodiment, the novel pyroelectric detective device is incorporated into a THz reflectance spectroscope, which may be configured as a portable handheld unit. The unit may additionally include a broadband mercury source, stereoscopic detection scheme for localization, and a visible camera for overlaying images, such as an active pixel sensor.

In one embodiment, the present invention provides a pyroelectric detection device comprising a pyroelectric element comprising a first surface and an opposite second surface, a first conductive layer adjacent to the first surface of the pyroelectric element, the first conductive layer comprising a periodic array of plasmonic absorbers to transfer energy of terahertz (THz) frequency range electromagnetic radiation incident on the first conductive layer into heating of the pyroelectric element and a second conductive layer adjacent to the second surface of the pyroelectric element.

The plasmonic absorbers of the periodic array simultaneously provide capacitive and inductive coupling of the electromagnetic radiation and each of the plasmonic absorbers of the periodic array includes a cross-shaped inset of the first conductive layer and a cross-shaped aperture in the first conductive layer dimensioned to surround the cross-shaped inset.

The pyroelectric detection device of claim 1, wherein the pyroelectric element includes one or more of, $LiTaO_3$, $BaTiO_3$, $LiNbO_3$, $SrNb_{1-x}Ba_xNb_2O_6$, where $0.2<x<0.7$, $Pb_{x^-}Me_yMe'_zO_3$, where $x+y+z=2$, Me is selected from a divalent ion and Me' is selected from a pentavalent ion, and $Hf_xMe_{(1-x)}O_2$, where Me is selected from a combination of Zr, Ti, Pb, Ba, Si, or Al and triglycine sulfate.

The pyroelectric detection device may further include measurement circuitry coupled to the first conductive layer and to the second conductive layer, the measurement circuitry to measure an electrical signal generated in the pyroelectric element in response to the heating of the pyroelectric element.

In an additional embodiment, the present invention provides a method for detecting terahertz (THz) frequency range electromagnetic radiation. The method includes positioning a pyroelectric detection device to receive THz frequency range electromagnetic radiation, the pyroelectric detection device comprising a pyroelectric element comprising a first surface and an opposite second surface, a first conductive layer comprising a periodic array of plasmonic absorbers adjacent to the first surface of the pyroelectric element and a second conductive layer adjacent to the second surface of the pyroelectric element. The method further includes, absorbing energy of the THz frequency range electromagnetic radiation by the periodic array of plasmonic absorbers, transferring the energy absorbed by the periodic array of plasmonic absorbers to heat the pyroelectric element and measuring an electrical generated in the pyroelectric element in response to the heating of the pyroelectric element. In particular, each of the plasmonic absorbers of the periodic array utilized in the method of the present invention includes a cross-shaped inset of the first conductive layer and a cross-shaped aperture in the first conductive layer dimensioned to surround the cross-shaped inset.

In another embodiment, the present invention provides a non-contact terahertz (THz) reflectance spectroscope for identifying a compound of interest. The spectroscope includes a light source to emit far-infrared wavelength electromagnetic radiation focused on a target of interest, a camera focused on the target of interest, one or more pyroelectric detection devices to receive electromagnetic radiation reflected from the target of interest, each of the one or more pyroelectric detection devices comprising. In particular, each of the one or more pyroelectric detection devices includes a pyroelectric element comprising a first surface and an opposite second surface, a first conductive layer adjacent to the first surface of the pyroelectric element, the first conductive layer comprising a periodic array of plasmonic absorbers to transfer energy of terahertz (THz) frequency range from the electromagnetic radiation incident on the first conductive layer into heating of the pyroelectric element, a second conductive layer adjacent to the second surface of the pyroelectric element, measurement circuitry coupled to the first conductive layer and to the second conductive layer, the measurement circuit to measure an electrical signal resulting from the heating of the pyroelectric element to generate reflectance spectra and analysis circuitry to compare the reflectance spectra to known spectra to identify a compound of interest present in the target of interest. In particular, each of the plasmonic absorbers of the periodic array utilized in the spectrometer of the present invention includes a cross-shaped inset of the first conductive layer and a cross-shaped aperture in the first conductive layer dimensioned to surround the cross-shaped inset.

BRIEF DESCRIPTION OF THE DRAWINGS

For a fuller understanding of the invention, reference should be made to the following detailed description, taken in connection with the accompanying drawings, in which:

FIG. 25 is a chart showing the number of positives, false positives, negatives, and false negatives based on specific functional R-group.

DETAILED DESCRIPTION OF THE INVENTION

Figure 1:
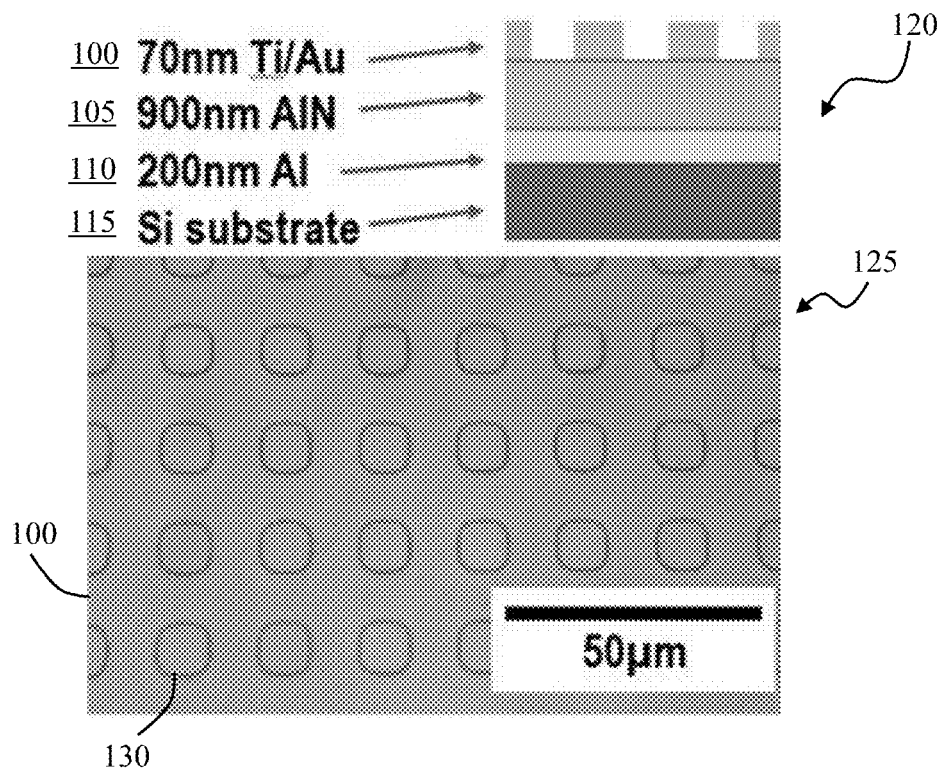
FIG. 1 is an optical microscope image of hole patterned pyroelectric detection device with a 20 μm spacing between holes which comprises a pyroelectric element of AlN and an inset illustrating a cross section of the structure design.

In the following detailed description of the preferred embodiments, reference is made to the accompanying drawings, which form a part thereof, and within which are shown by way of illustration specific embodiments by which the invention may be practiced. It is to be understood that other embodiments may be utilized, and structural changes may be made without departing from the scope of the invention.

As used in this specification and the appended claims, the singular forms "a," "an," and "the" include plural referents unless the content clearly dictates otherwise. As used in this specification and the appended claims, the term "or" is generally employed in its sense including "and/or" unless the context clearly dictates otherwise.

In various embodiments, the present invention provides a device and method for more accurately, quickly, and effectively detecting electromagnetic waves having terahertz (THz) wavelengths. A particular embodiment includes a detector configured to receive and demodulate THz waves to identify various objects or substances.

Pyroelectric detectors have relatively high room temperature sensitivity at far-infrared wavelengths beyond 20 μm making them preferable to helium-cooled bolometers for certain field applications. Pyroelectrics are thermal detectors that produce a transient voltage. They are widely used for optical power sensing due to their broadband wavelength response and there has been recent interest in integrating them with resonant absorbers to create spectral sensors. In such spectral sensor designs, a thin-film metamaterial absorber is applied to the pyroelectric surface to engineer a surface impedance that matches that of free space ($Z_0 \approx 377\Omega$), at specific wavelengths.

In various embodiments, two pyroelectric materials are explored as the basis of a spectrally selective far-IR detector, namely aluminum nitride (AlN) and lithium tantalate (LiTaO$_3$). Exemplary complex permittivity $\varepsilon$ at 1 THz, mass density $\rho$, thermal conductivity k, specific heat c, and pyroelectric coefficient $p_i$ for AlN and LiTaO$_3$ are provided in Table I.

TABLE I

| | AlN [Poly] | LiTaO$_3$ [001] |
|---|---|---|
| $\varepsilon$ @ 1 THz [F/m] | 8.17 ± 0.009i | 46.73 + 4.17i |
| $\rho$ [kg/m$^3$] | 3260 | 7460 |
| k [W/(m · K)] | 160 | 4.6 |
| c [kJ/(kg · K)] | 0.74 | 0.251 |
| $p_i$ [μC/(m$^2$ · K)] | 6-8 | −230 |

As shown in Table I, LiTaO$_3$ has the advantage of higher pyroelectric coefficient, lower thermal conductivity and lower specific heat over AlN. Alternatively, AlN is more convenient for device processing because it may be reactively sputtered to form low-heat-capacity thin films that are easily patterned.

The voltage across a pyroelectric material is given by Equation (1), with H being the thickness of the pyroelectric material and $A_d$ being the area of the pyroelectric detective element.

$$V_{out} = \frac{\Delta Q}{C_d} = \frac{p_i A_d \Delta T}{(\varepsilon_r \varepsilon_0 A_d / H)} = \frac{p_i H \Delta T}{\varepsilon_r \varepsilon_0} \quad (1)$$

This relationship allows a comparison of sensitivity to a pyroelectric detector, as seen in Equations (2) and (3), which calculates the change in voltage output for a given change in a parameter of the detector.

$$\frac{\partial V_{out}}{\partial p_i} = \frac{1}{C_d} \frac{\partial (\Delta Q)}{\partial p_i} = \frac{\partial \left(\frac{p_i H \Delta T}{\varepsilon_0 \varepsilon_r A}\right)}{\partial p_i} = \frac{H \Delta T}{\varepsilon_0 \varepsilon_r} \quad (2)$$

$$\frac{\partial V_{out}}{\partial H} = \frac{1}{C_d} \frac{\partial (\Delta Q)}{\partial H} = \frac{\partial \left(\frac{p_i H \Delta T}{\varepsilon_0 \varepsilon_r A}\right)}{\partial H} = \frac{p_i \Delta T}{\varepsilon_0 \varepsilon_r} \quad (3)$$

Additionally, $\Delta T$ is an inherent function of geometry. Complementing voltage sensitivity, there is also the thermal response time ($\tau_{thermal}$) of a detector detailed in Equation (4).

$$\tau_{thermal} = \frac{C_{th}}{G_{th}} = \frac{c \rho H}{k} \quad (4)$$

To maintain a metamaterial structure with an impedance of $Z_0$, several factors are considered. One spectral filtering technique employs the use of square hole arrays in metal.

The maximal free space absorption wavelength within the far-infrared range ($\lambda_{max}$) can be predicted via Equation (5) where d is the period of the array, and $n_d$ is the refractive index of the pyroelectric material. One surface structure known in the art that can achieve a $Z_0$ surface impedance is a periodic array of square holes in a metal film. Absorption peaks at resonant wavelengths are given by:

$$\lambda_{max} \approx \frac{d * n_d}{\sqrt{k^2 + j^2}} \quad (5)$$

where the maximal free space absorption wavelength within the far-infrared range ($\lambda_{max}$) can be predicted via Equation (5) where d is the period of the array, $n_d$ is the pyroelectric's refractive index and k and j are integers. More elaborate thin-film designs have been shown to give strong resonant absorption in the THz range.

Other spectral filtering techniques have also been demonstrated using unique absorber designs in an attempt to fill the "terahertz gap". These designs are manufactured to achieve strong absorptions in the THz regions, in which it has been challenging to find any naturally existing materials that exhibit such properties. As such, in various embodiments of the present invention, an absorber design has been implemented that utilizes a cross-shaped (+) conductive feature insert in a hollow feature of similar geometry to provide a spectrally selective pyroelectric THz detector.

As previously described, pyroelectric detector devices are known that include an absorption structure comprising square apertures. In particular, a known embodiment of a detector device employing AlN as the pyroelectric element and an absorption structure comprising an array of square apertures is shown in FIG. 1. With reference to FIG. 1, the inset presents a design for a hole patterned detector. The period of the patterned holes in this design is 20 μm, due to the availability of existing photolithography masks, although Equation (5) predicts fundamental resonances slightly short of the minimum wavelength of interest. As shown in the inset of FIG. 1, AlN films 105 of 900 nm thickness were reactively sputtered onto a 200 nm thick aluminum (Al) layer 110 that was sputtered onto (100) undoped silicon (Si) substrate 115, without breaking vacuum. The Al layer 110 serves as a back contact and the resonance wavelength is considered to be independent of this Al layer 110. An array of nominally square holes in a 70 nm gold (Au) metal film 100 was then fabricated onto the AlN layer 105 by contact photolithography using 15 nm titanium (Ti) as the usual sticking layer. The thickness of the top metallic layer of Ti/Au 100 was determined from the crystal monitor and e-beam evaporator tooling factors.

An optical microscope image 125 of a top-down view of the Ti/Au layer 100 having an array of nominally square holes 130 with a 20 μm period is also shown in FIG. 1. As shown in the optical microscope image 125 the fabricated metal structures achieved good fidelity to the mask pattern, with the exception of slight rounding of the hole corners.

Three dimensional electromagnetic simulations were performed for the AlN hole-patterned structure 120 based on the finite element method. The procedure consisted of launching a linearly polarized plane wave with an electric-field-amplitude of 1 V/m toward the resonant structure 120 and computing the E-field over the simulation space. The reflection coefficient was determined from the S11 parameter calculated directly by the software and then plotting its absolute value. Matched boundary conditions were used in the FEM (finite element method) simulations and tetrahedral elements were used to discretize the computational domain. The frequency-dependent optical constants "n" and "k" values were used as material parameters for the simulation. The simulated volume was discretized in 100,000 domain elements which results in a simulation with 2.5 degrees of freedom and a solution was obtained for a frequency sweep that ranged from 6 to 150 THz in 0.5 THz increments.

Figure 2:
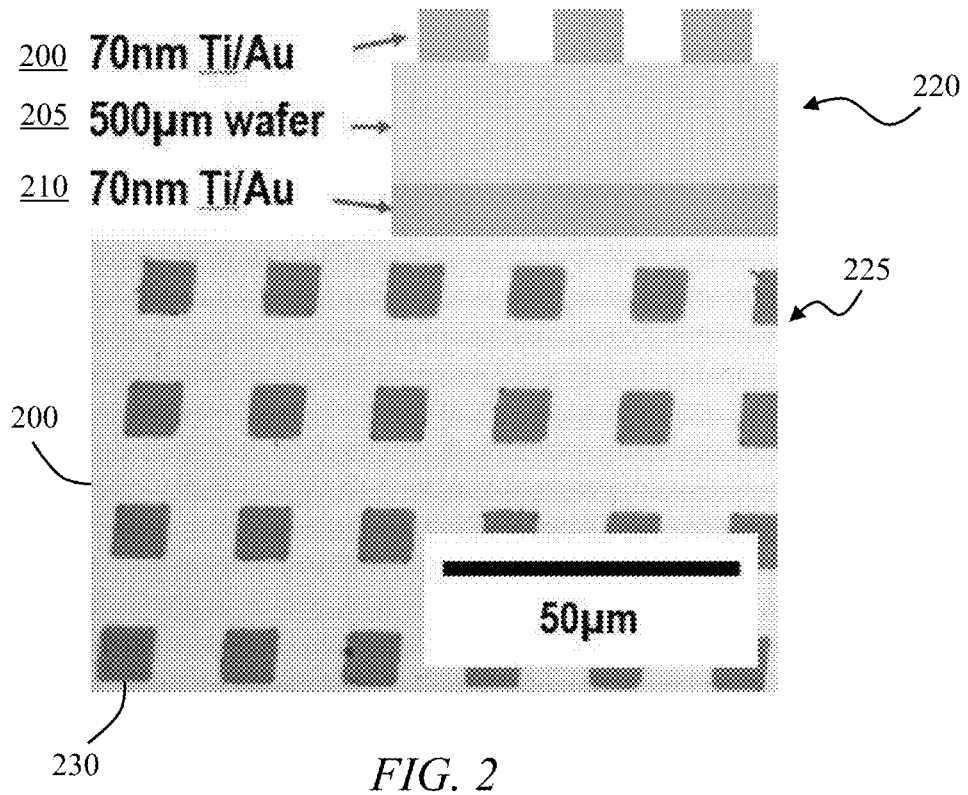
FIG. 2 is an optical microscope image of a hole patterned pyroelectric detection device with a 20 μm spacing between holes which comprises a pyroelectric element of $LiTaO_3$ and an inset illustrating a cross section of the structure design.

An embodiment of an additional known detector device 220 employing LiTaO$_3$ as the pyroelectric element and an absorption structure comprising an array of square apertures is shown in FIG. 2. As shown in FIG. 2, a 70 nm Ti/Au back contact 210 was deposited via e-beam evaporation and a nominally square hole array 200 was fabricated on a 500 μm thick Z-cut single-crystal LiTaO$_3$ wafer 205 using a similar process as that described with reference to the AlN sample of FIG. 1.

An optical microscope image 225 of a top-down view of the Ti/Au layer 200 having an array of nominally square holes 230 with a 20 μm period is also shown in FIG. 2. As shown in the optical microscope image 225 the fabricated metal structures achieved good fidelity to the mask pattern except for slight rounding of the hole corners. The slightly parallelogram shape of the holes on the LiTaO$_3$ was due to using a grating mask with two exposures and imperfect 90 deg. rotation.

Responsivity for the detectors 120, 220 with square-hole absorbers was characterized using a tube-furnace blackbody at 1000° C. The IR irradiation on the detector was mechanically chopped detector voltage was amplified and electronically filtered by a preamp then synchronously amplified by a lock-in amplifier. Incident power within the estimated response band was calculated from the blackbody radiance, blackbody aperture area and solid angle subtended by the detector from the blackbody aperture. Responsivity is voltage produced by the detector before amplifier gain divided by in-band incident IR power. Detectivity D* was determined by dividing responsivity by the noise spectral density measured at frequencies above the 1/f contribution using a spectrum analyzer and multiplying by the square root of the detector area.

Figure 3:
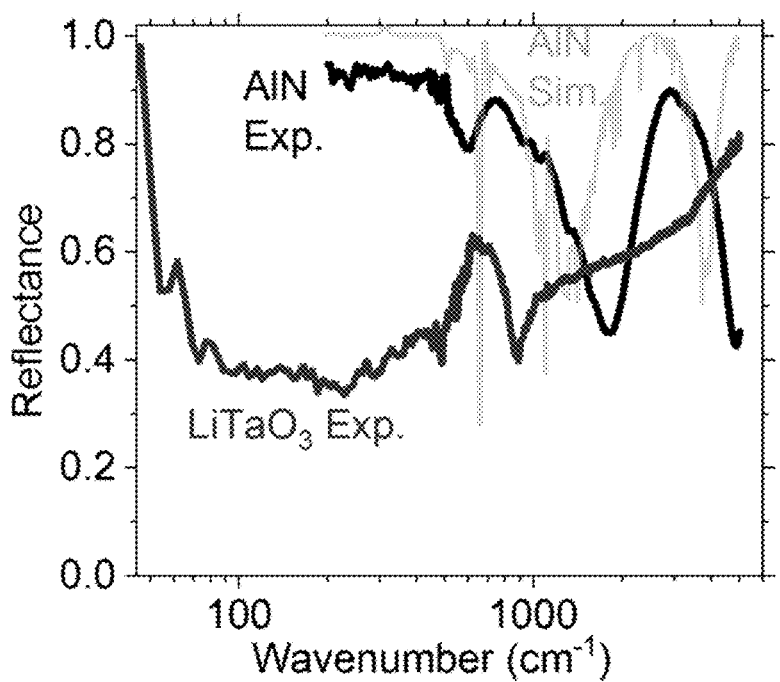
FIG. 3 illustrates reflectivity spectra for samples with 20 μm-period hole patterns on AlN and $LiTaO_3$.

FIG. 3 illustrates a comparison of the experimental reflectance spectra 300 for the AlN detector 125 with a simulation of the reflectance spectra 305. As shown, broad absorption features occur in the long wave to far infrared. An experimental 300 resonance occurs at 1802 cm$^{-1}$ (54 THz) with a full width half max (FWHM) of 980 cm$^{-1}$ (29.4 THz). A secondary resonance at 715 cm$^{-1}$ (21.4 THz) may be attributed to the extinction coefficient of the AlN, but the simulation 305 suggests that this is the fundamental resonance. In fact, the two strongest broad bands are also present in simulations performed at 5- and 10-micron period, and hence seem unrelated to the hold pattern. The spiky noise in the simulation is a numerical artifact, wherein to shorten an already long simulation, the simulation volume was made smaller than ideal, which can result in spurious reflections even with perfectly matched layers as boundary conditions. The small differences in band positions are likely due in part to uncertainly in the AlN optical constants used as simulation input because these can vary significantly with deposition conditions. Fabrication tolerance and rounding of corners on the fabricated holes may also affect the agreement.

FIG. 3 additionally presents experimental results for the hole-patterned LiTaO$_3$ detector 225 of FIG. 2. As shown, a relatively sharp feature occurs at 891 cm$^{-1}$ (26.7 THz) with FWHM of 196.8 cm$^{-1}$ (5.90 THz) and a broad absorbance band ranges from 61.7 to 621 cm$^{-1}$ (1.86 to 18.6 THz). This is contrary to the expected sharp absorption peaks. A possible explanation is the small hole height to width ratio.

The band for the blackbody radiance calculation to determine LiTaO$_3$ detector 225 responsivity was taken as 50 to 3000 cm$^{-1}$ (3.33 to 200 μm) based on FIG. 3. A maximum responsivity of 300 mV/W at a chopping frequency of 10 Hz was determined. With a detector area of 0.30 cm$^2$ and a noise spectral density of 103 nV/$\sqrt{Hz}$, a D* value of 1.6×10$^6$ Jones results.

The band for the blackbody radiance calculation to determine AlN detector 125 responsivity was taken as 1000 to 3000 cm$^{-1}$ (3.33 to 10 μm) based on FIG. 3. These AlN detectors exhibited a maximum responsivity of 790 μV/W. With a detector area of 2.2 cm$^2$ and noise spectral density of 22 nV/$\sqrt{Hz}$, the corresponding D* is 5.3×10$^4$ Jones, which is 30 times lower than for the LiTaO$_3$ detector 225.

Figure 4:
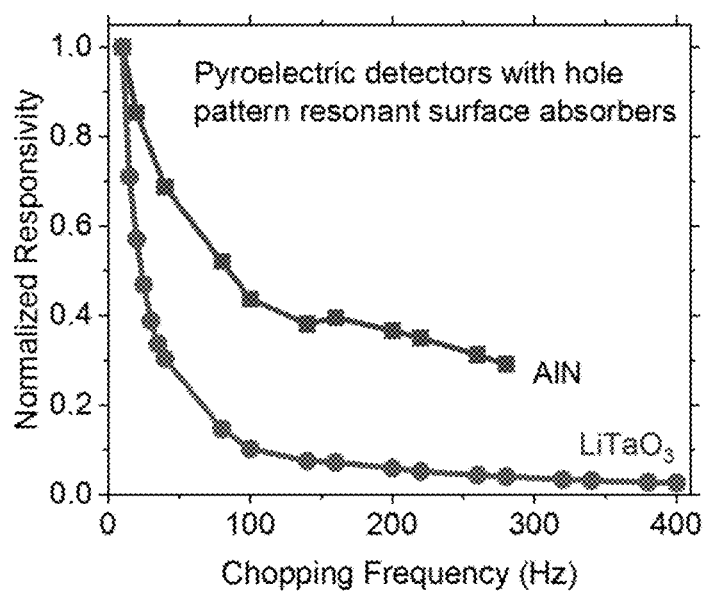
FIG. 4 illustrates a normalized detector response vs. chopping frequency for hole patterned AlN and $LiTaO_3$ detectors.

FIG. 4 presents the normalized responsivity as a function of chopping frequency for both hole-patterned detectors illustrated in FIG. 1 and FIG. 2. As shown, while the LiTaO$_3$ samples are more responsive, they are also considerably slower than the AlN samples. This is because the LiTaO$_3$ samples are much thicker and thus have a much higher thermal capacity than the AlN samples. AlN also has a much higher thermal conductivity (Table I).

From the simulations conducted considering the square hold patterns of FIG. 1 and FIG. 2, two abstractions can be made regarding designing a proficient absorber. The first is that there is a strong dependence on the pyroelectric layer thickness in which said layer can provide useful capacitive coupling between the electrode contacts. The second is that regardless of interlayer coupling, there is a necessity of the incident absorbing layer to provide a strong resonating feature. Holes with uniaxial dimensions on the order of m will enable adequate interaction with a wave propagating in free space though they provide little to no capacitive coupling. Thus, the only possible resonance which could be attributed to the layer is via inductive and resistive loads, which may circulate the openings. In general, the square hole detectors in FIG. 1 and FIG. 2 are spectrally broad absorbers, but they are not spectrally selective.

Figure 5:
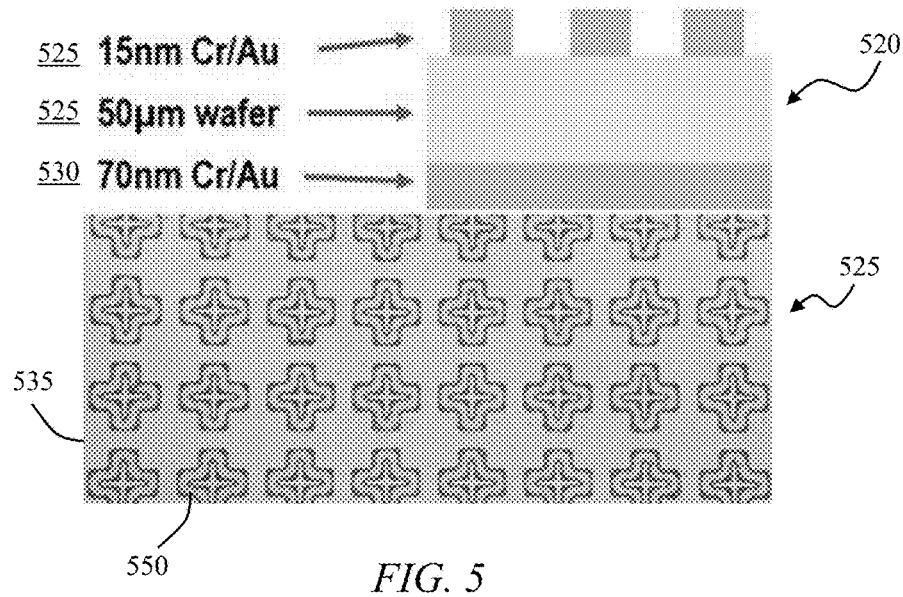
FIG. 5 illustrates an optical microscope image of a cross-antenna patterned detector and an inset illustrating a cross section of the cross-antenna patterned structured, in accordance with an embodiment of the present invention.

An exemplary embodiment of the cross-antenna design resonator 525 for THz electromagnetic wave absorption, in accordance with the present invention, is illustrated in FIG. 5. In this exemplary embodiment the cross-antenna design resonators 550 are deposited in an array 520 on a thinner LiTaO$_3$ wafer 525. In particular, prior to any contact lithography process, z-cut LiTaO$_3$ wafers 525 were cleaned and a multilayer back contact 530 of 70 nm Cr/Au was deposited via e-beam evaporation. Following the contact photolithography process, the resulting detector employed arrays of the cross-antenna design antennas to develop the active area absorber 535. The metallic layer 535 was crafted from 15 nm layered Cr/Au e-beam evaporation. While this structure 520 will enable the output of THz electrical signals, the pyroelectric nature of the LiTaO$_3$ will also enable the electrical pickup of signals corresponding to the modulation of incident THz waves. Alternatively, the patterned metallic layers 530, 535 may be fabricated of various other conductive elements, including by not limited to Ti/Au.

Figure 6:
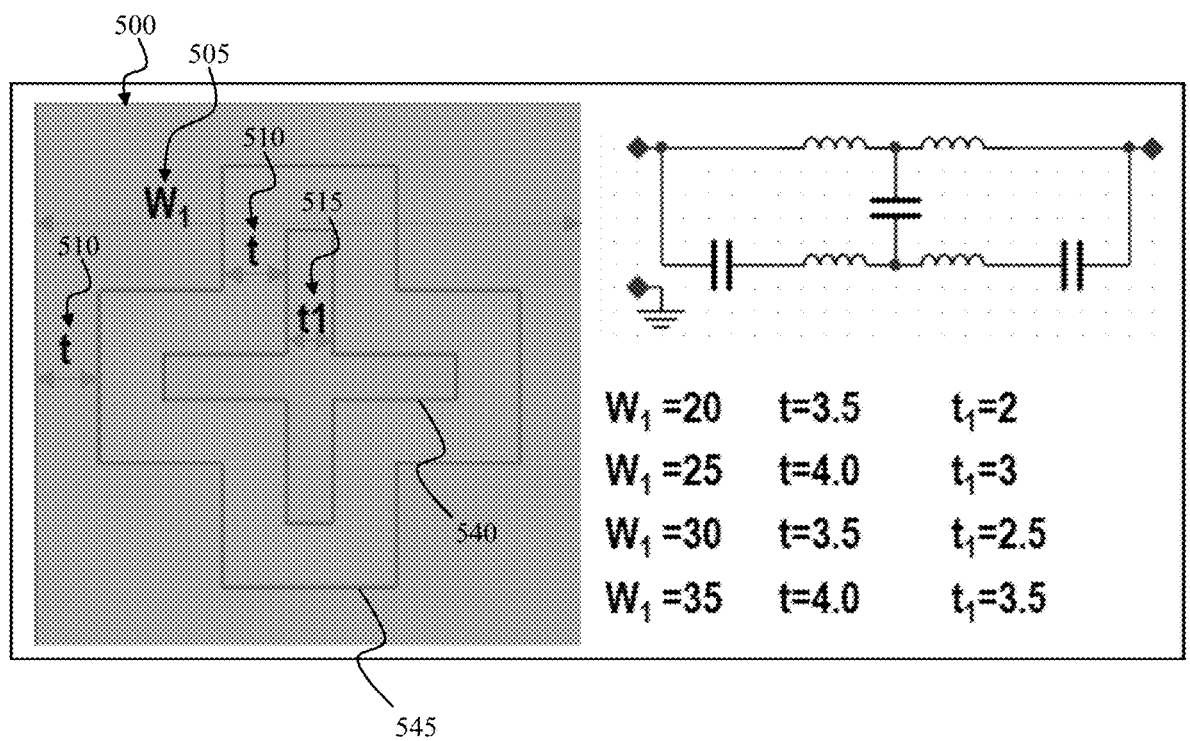
FIG. 6 illustrates a detailed view of the cross-antenna design for the pyroelectric detection device, in accordance with an embodiment of the present invention.

The cross-antenna design 500 resonator includes an array 525 of plasmonic absorbers 550 which utilize simultaneous capacitive and inductive loads, thus enabling much sharper absorbance features. In particular, with reference to FIG. 6, each of the plasmonic absorbers 500 of the array 520 comprises a cross-shaped inset 540 of the Cr/Au conductive layer 535 and a cross-shaped aperture 545 in the Cr/Au conductive layer 535, wherein the cross-shaped aperture 545 is dimensioned to surround the cross-shaped inset 540. The cross-shaped inset 540 of the conductive layer Cr/Au conductive layer 535 has a first width (t1) 515. The cross-shaped aperture 545 in the Cr/Au conductive layer 535 has a second width (t) 510 that is greater than the first width (t1) 515 of the cross-shaped inset 540. In addition, each of the plasmonic absorbers 520 are separated by the second width (t) 510 and a total width (W1) 505 of each of the plasmonic absorbers 500 is equal to the first width (t1) 515 plus twice the second width (t) 510. In general, the total width (W1) 505 of each of the cross-shaped plasmonic absorbers 500 determines a primary frequency of the pyroelectric detection device. Additionally, the first width (t1) 515 and the second width (t) 510 of the cross-shaped plasmonic absorbers 500 determines the peak magnitude of the pyroelectric detection device.

For the THz spectral response of the cross-antenna patterned detectors, a mechanically-chopped series tunable backward wave oscillator (BWO) was used. A black polyethylene sheet was used to block thermal IR from the heated cathode of the BWO and the signal from the detector was amplified and electronically filtered using a voltage preamplifier and read out to an oscilloscope. Responsivity was estimated using the power spectrum of the BWO published in its manual.

Figure 7:
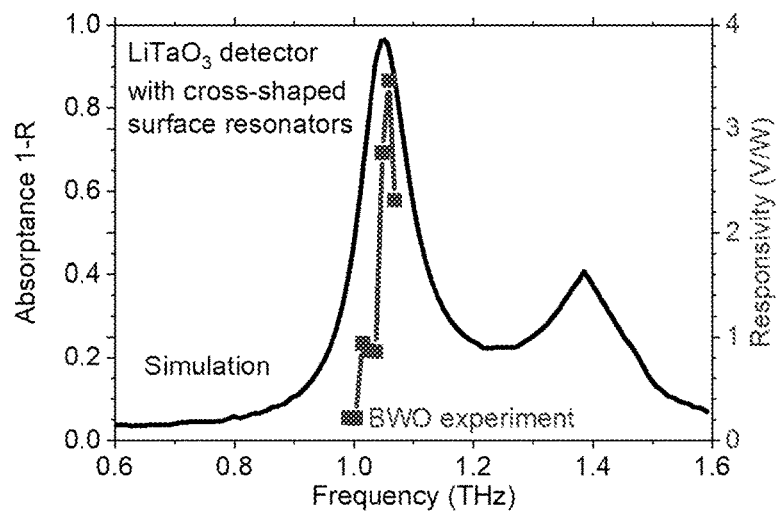
FIG. 7 illustrates the simulated absorptance and measured responsivity spectra for an $LiTaO_3$ with cross-shaped surface resonators, in accordance with an embodiment of the present invention.

FIG. 7 illustrates the THz spectral response of the cross-antenna patterned detectors of the present invention. As previously described, this design combines capacitive and inductive loads and is expected to give sharper resonances which depend on pyroelectric layer thicknesses. The simulated absorptance spectrum is shown in FIG. 7, wherein an $S_{11}$ or self-reflection peak of R=−14.64 dB was found at 1.05 THz (285.5 μm) with a FWHB of 0.044 THz. Absorptance is taken as 1-R. This demonstrates that possibility of excellent spectral selectivity in detectors utilizing the cross-antenna patterned detectors of the present invention. In the simulation, strong field enhancement can be seen at resonance for the inventive structure, which implies efficient transfer of energy from incident radiation into heating of the pyroelectric element.

FIG. 7 additionally presents the measured responsivity spectra for the LiTaO$_3$ detector with cross-antenna pattern. Though the BWO tuning range is limited in comparison to the simulation range, the detector response appears to closely match the simulated response. The width of the measured response is surprisingly smaller than the simulation. The maximum responsibility 3.5 V/W occurs at 1.06 THz for 10 Hz chopping frequency. The peak location agrees well with the simulation. The area of the detector is 4.5×10$^{-2}$ cm$^2$ and the nose spectral density of the detector is 0.38 μV/$\sqrt{Hz}$ leading to D*=2.0×10$^6$ Jones. This D* value is comparable to the square hold patterned detector of FIG. 2, but with better selectivity. As such, the cross-antenna patter on LiTaO$_3$ of the present invention showed a distinct responsivity peak at 1.06 THz in both simulation and experiment and its D* of 2.0×10$^6$ approaches that of commercial pyroelectric detectors, but with the advance of spectral selectivity. The inventive detector design can therefore be refined to reach D* suitable for commercial applications, which would enable production of uncooled selective detectors able to detect near 1 THz, where specific security and contraband sensing applications exist.

Various embodiments of the present invention may be used in a variety of detection mechanisms. For example, the present invention could be used for identifying counterfeit money via observing existing tracers within the inks of money that have a specific optical quality within the THz wavelength; detecting objects in space; detecting illicit or hazardous substances, such as explosive materials and fentanyl; and screening parcels for certain substances or objects; or pharmaceutical identification. An example of the present invention was manufactured and tested in identifying fentanyl. The present invention can also test for various other objects and substances including but not limited to energetic materials, pharmaceuticals, or designated marks such as currency anticounterfeit markers or trackers.

Figure 8:
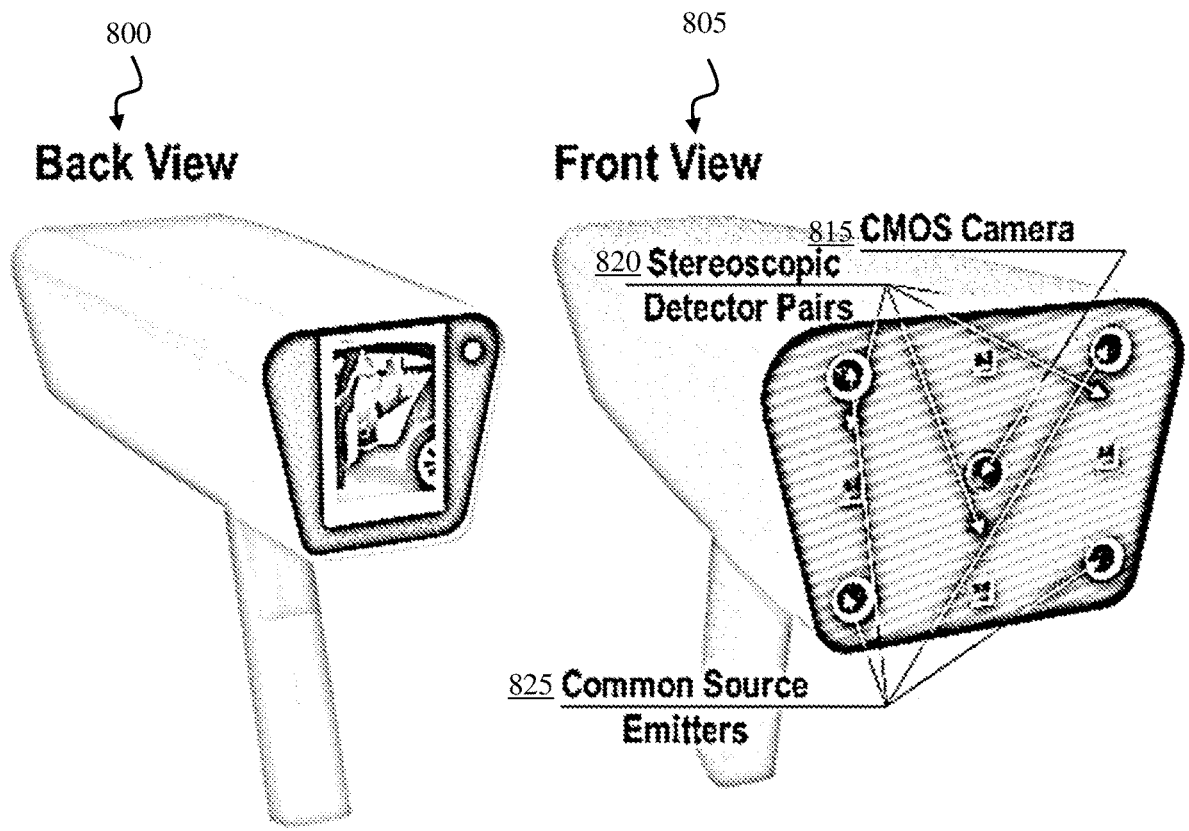
FIG. 8 depicts an embodiment of a portable handheld detector unit comprising one or more pyroelectric cross-antenna detection devices, in accordance with an embodiment of the present invention.

In a specific embodiment, remote detection can be achieved by incorporating the THz reflectance spectroscopy in a portable handheld unit depicted in FIG. 8, wherein a back view 800 and a front view 805 of the portable handheld unit are illustrated. The unit may include a broadband mercury (Hg) source (e.g., Hg bulb), stereoscopic detection scheme for localization, and a visible camera 815 for overlaying images 810 of a target of interest, such as an active-pixel sensor (CMOS camera). Common source emitters 825, and stereoscope detector pairs 820, such as the cross-shape pyroelectric detection devices of the present invention are also included in the handheld detector. The Hg bulb provides a stronger signal than an internal detector. The unit may further include machine learning technology to develop a detection database along with a simple user interface. For user interaction with the target of interest, a viewscreen with minimal buttons for accurate readings and ease of user interaction may also be provided.

Figure 9:
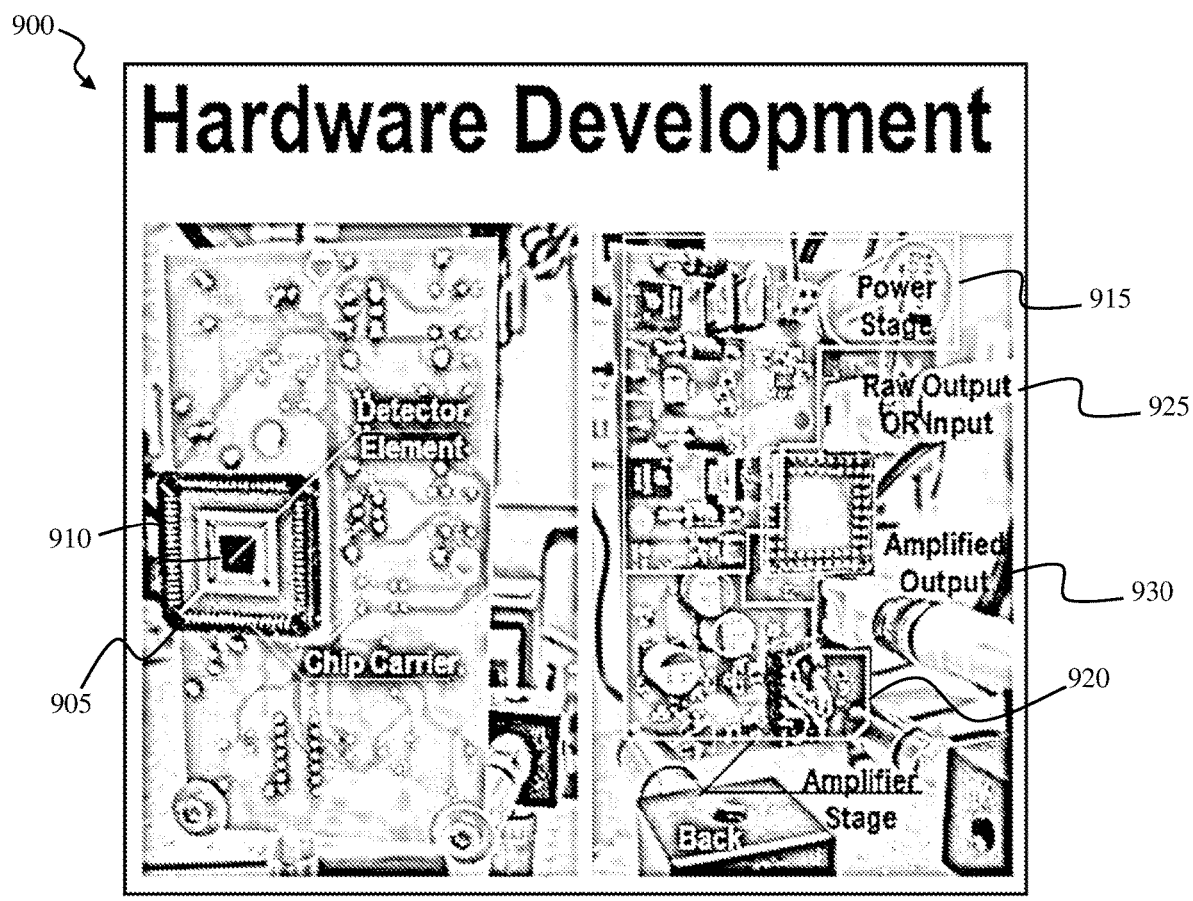
FIG. 9 depicts hardware of an embodiment of a handheld unit that includes a detector element, chip carrier, power stage, raw power input/output, amplifier output, and an amplifier stage, in accordance with an embodiment of the present invention.

Additionally, FIG. 9 depicts exemplary hardware 900 of the handheld unit that includes a pyroelectric detector element 910, chip carrier 905, power stage 915, raw power input/output 925, amplifier output 930 and an amplifier stage 920. The amplifier may include a multistage amplifier/filter that enables enhancement of the modulated signal and broadband amplification of 40 dB gain during testing. A signal board design may include DC/DC converter with low pass filters and amplifiers. A bipolar buck-boost converter may be used to provide±5V rails. Crosstalk may be prevented by separation of the components.

In one embodiment, the cross-shaped pyroelectric detection device of the present invention is be implemented into the handheld spectrometer shown in FIG. 8 and FIG. 9. In particular, the cross-shaped pyroelectric detection device may be incorporated into a spectrometer device for the identification of fentanyl.

Figure 10:
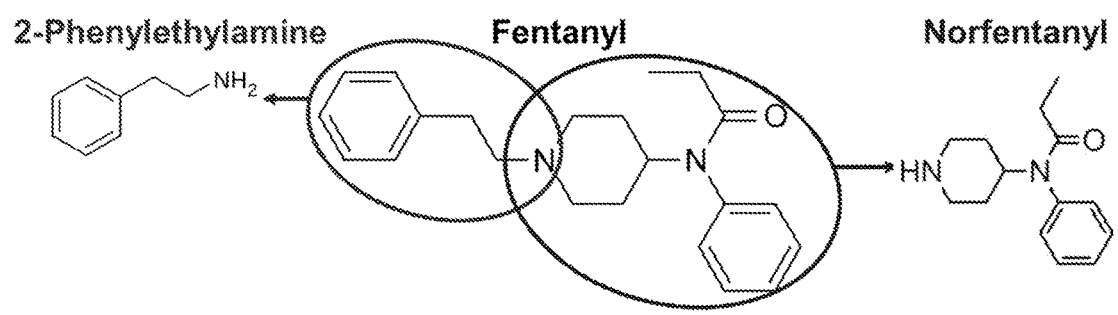
FIG. 10 illustrates fentanyl broken down into its constituents: 2-phenylethylamine (PEA), as 2-phenylethylamine HCL, and norfentanyl.

To develop a device capable of identifying fentanyl and its derivatives, the spectral features first need to be identified. Spectral features within the THz range vary, such that the features found within each constituent compound of fentanyl will exist in the composite, and some additional features will not be revealed. FIG. 10 depicts fentanyl broken down into its constituents: 2-phenylethylamine (PEA), as 2-phenylethylamine HCl, and norfentanyl. Breaking down fentanyl into its constituent compounds also enables the isolation of spectral features from fentanyl analogs.

Figure 11:
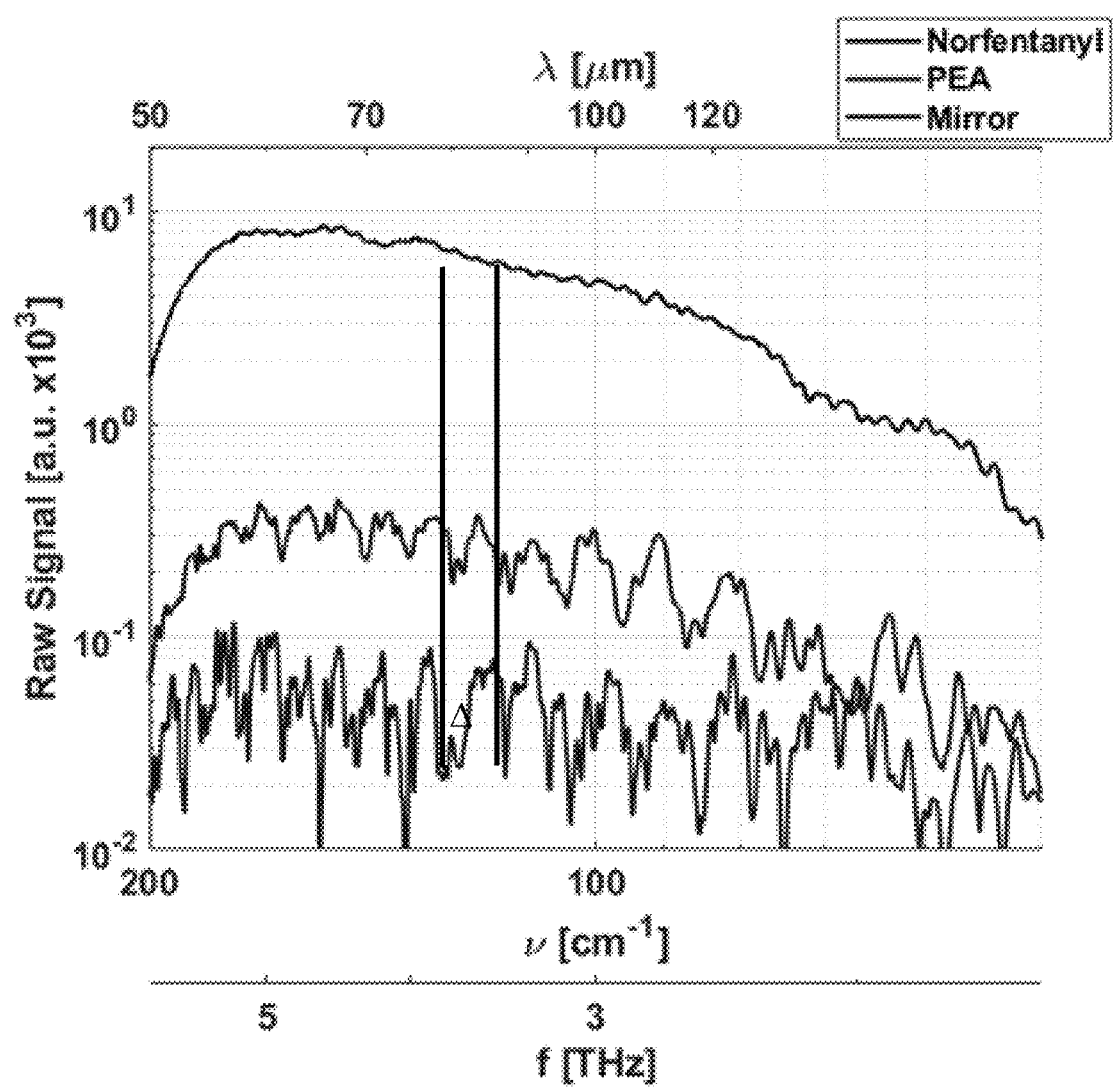
FIG. 11 illustrates a raw signal graph of norfentanyl, PEA, and the reference mirror.

Both transmission and reflection spectral measurements were obtained, the results of which are provided in FIG. 11. As depicted, PEA has a lower refractive index than norfentanyl, and the Δv between local minima and maxima indicates the film thickness and refractive index.

Figure 12:
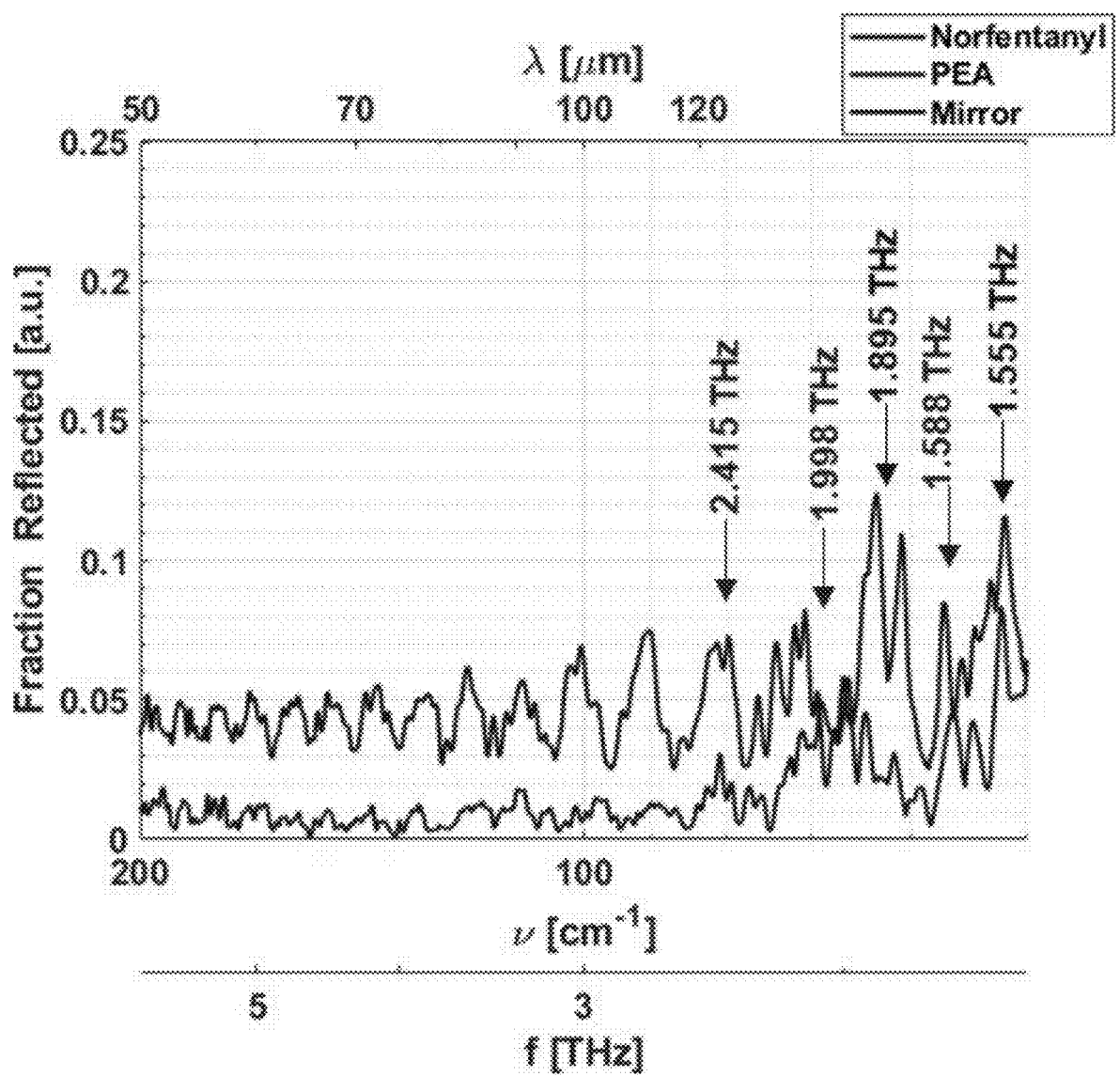
FIG. 12 is a graph depicting the several peaks that can be used for the identification of fentanyl and its derivatives.

The reflectance spectra were obtained and are shown in FIG. 12. Several peaks can be used for the identification of fentanyl and its derivatives. In particular, norfentanyl has a doublet at 1.9 THz and a second broad peak at 1.5 THz, while 2-phenylethylamine HCL has peaks at 1.6, 2.0, and 2.4 THz. Both norfentanyl and 2-phenylethylamine HCL exhibit decreased variation in min/max beyond 3 THz, indicating the leveling off of $\varepsilon'$ and increasing $\varepsilon''$.

Figure 13A:
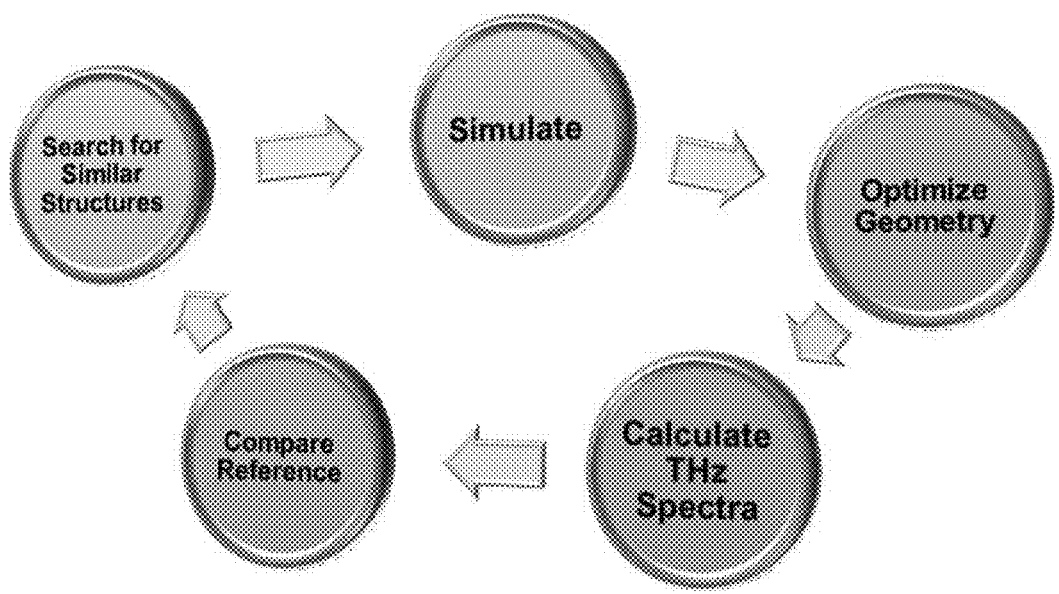
FIG. 13A is a flow chart depicting the use of machine learning to deconstruct the spectra of an unknown substance, in accordance with an embodiment of the present invention.
Figure 13B:
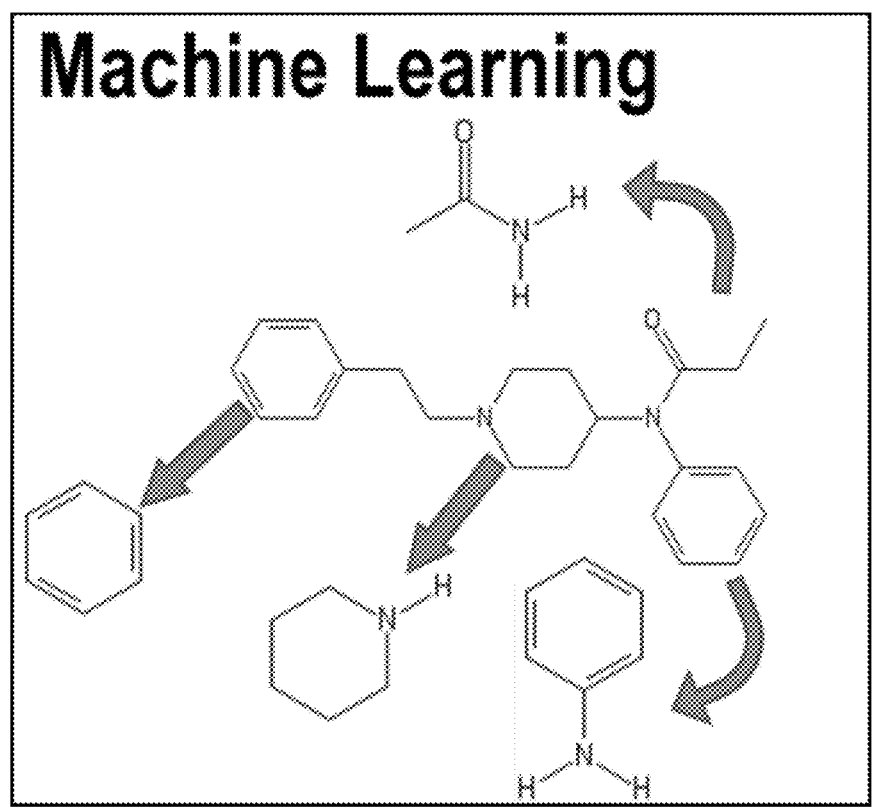
FIG. 13B is a diagram of machine learning used to analyze an unknown substance, in accordance with an embodiment of the present invention.
Figure 14:
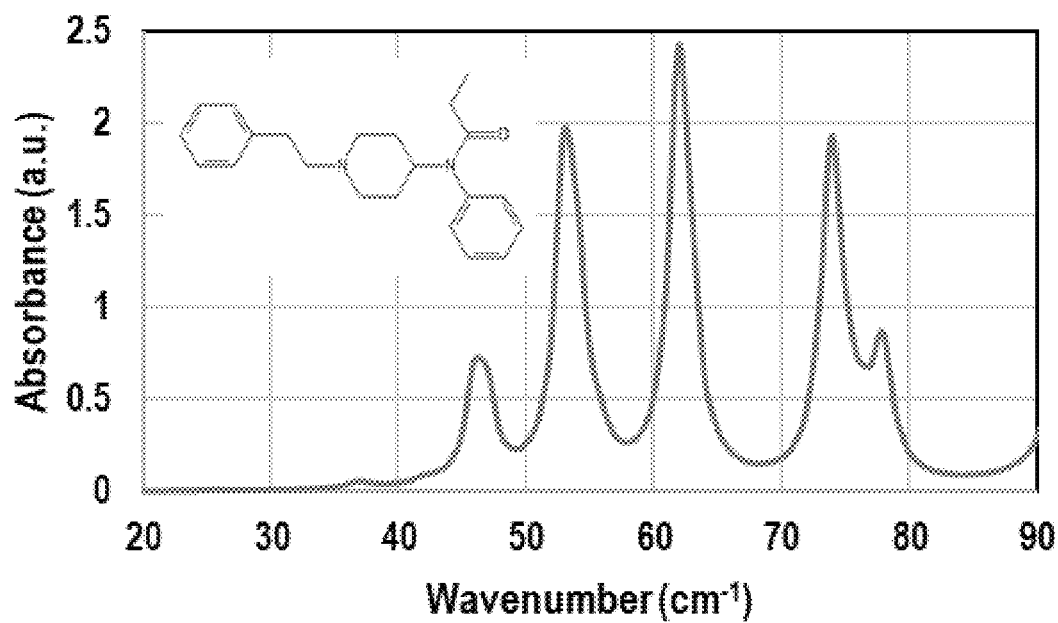
FIG. 14 is a graph depicting the absorbance spectra for fentanyl.

However, the measurement of fentanyl analogs is nearly impossible. For that reason, machine learning was used to deconstruct the spectra of unknown substances in accordance with FIGS. 13A and 13B. The spectra of unknown substances and their corresponding THz spectra were effectively calculated and compared to the results of one or more references to detect similar structures. Additionally, a fentanyl database was built. FIG. 14 depicts the absorbance spectra for fentanyl due to normal modes.

Similar spectra analysis and databases can be established for detecting various other objects and/or substances. The machine learning aspects of this project will be discussed in greater detail in a subsequent section.

Substances have electric and magnetic properties, such as complex permittivity $\varepsilon$ and complex permeability $\mu$, that determine wave propagation. At THz and above frequencies $\varepsilon = \varepsilon' + i\cdot\varepsilon''$ predominantly determines wave behavior. It is assumed that $\mu = \mu_r$.

Figure 15:
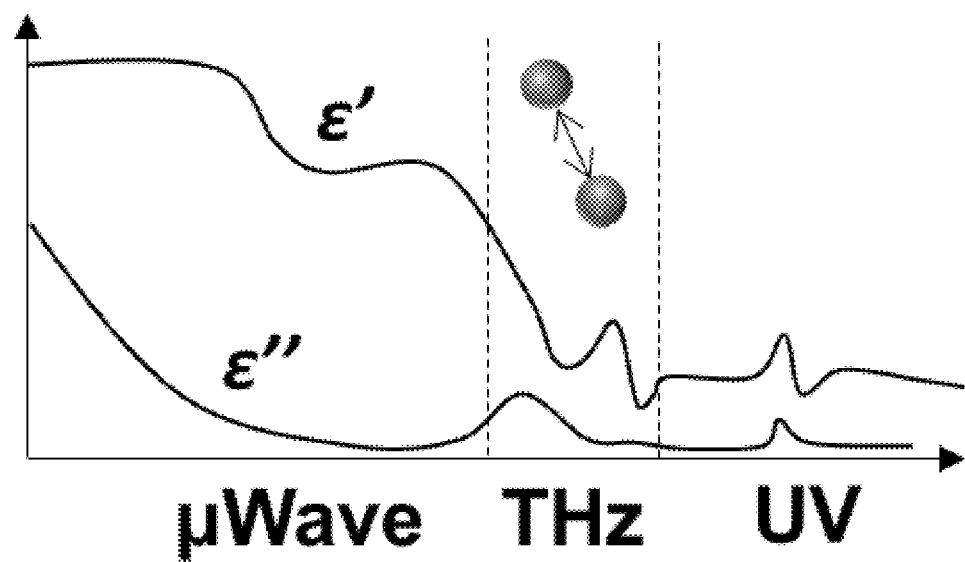
FIG. 15 illustrates a chart of $\varepsilon'$ and $\varepsilon''$.

As shown in FIG. 15, atomic rovibrational features account for features of $\varepsilon$ and $\varepsilon$ yields the refractive index (n) and extinction coefficient ($\kappa$), shown in Equations (6) and (7) below.

$$n = \{\tfrac{1}{2}\cdot[(\varepsilon'^2 - \varepsilon''^2)^{1/2} + \varepsilon']\}^{1/2} \qquad (6)$$

$$\kappa = \{\tfrac{1}{2}\cdot[(\varepsilon'^2 - \varepsilon''^2)^{1/2} - \varepsilon']\}^{1/2} \qquad (7)$$

For S polarized waves normally propagating from free space to a semi-infinitely thick material, reflection Ⓡ can be calculated, as shown in Equation (8) below.

$$R(\lambda) = \left|\frac{n_1(\lambda) - n_2(\lambda)}{n_1(\lambda) + n_2(\lambda)}\right|^2 \qquad (8)$$

Figure 16:
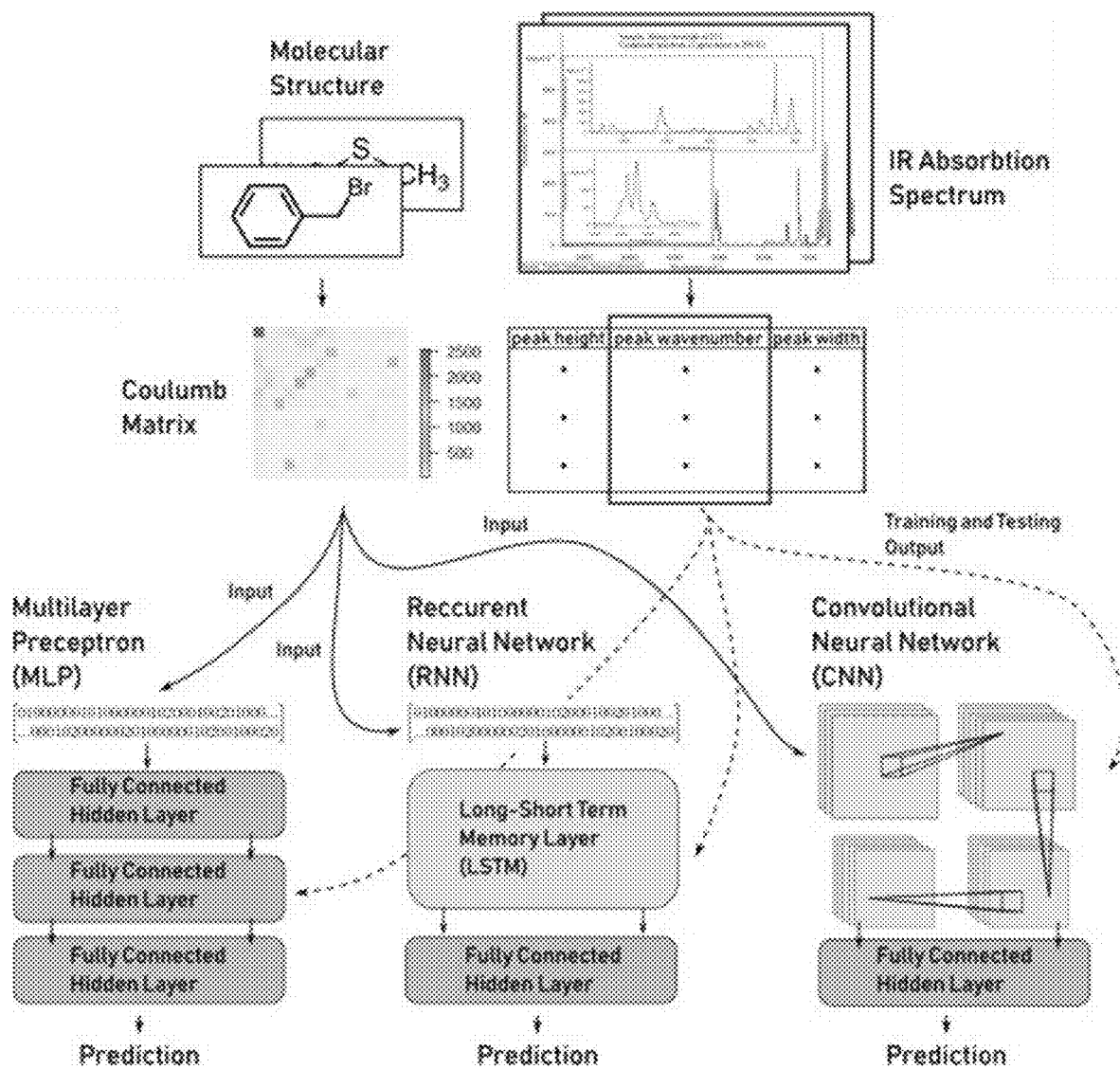
FIG. 16 illustrates the process of determining how to organize and predict an unknown compound when using various machine learning techniques, in accordance with an embodiment of the present invention.

As the measurement of fentanyl analogs is nearly impossible, machine learning was used to deconstruct the spectra of an unknown substance, and a THz spectrum was calculated and compared to the results of one or more references to detect similar structures. Machine learning, however, can be applied to measure analogs of any substance. A 360 molecule IR database was obtained, however, a much more extensive database in infrared is required for machine learning. The applied machine learning techniques of include logistic regression, classification trees, random forest, and neural network techniques. These machine learning techniques are then organized into useful prediction models, as illustrated in FIG. 16.

Figure 17:
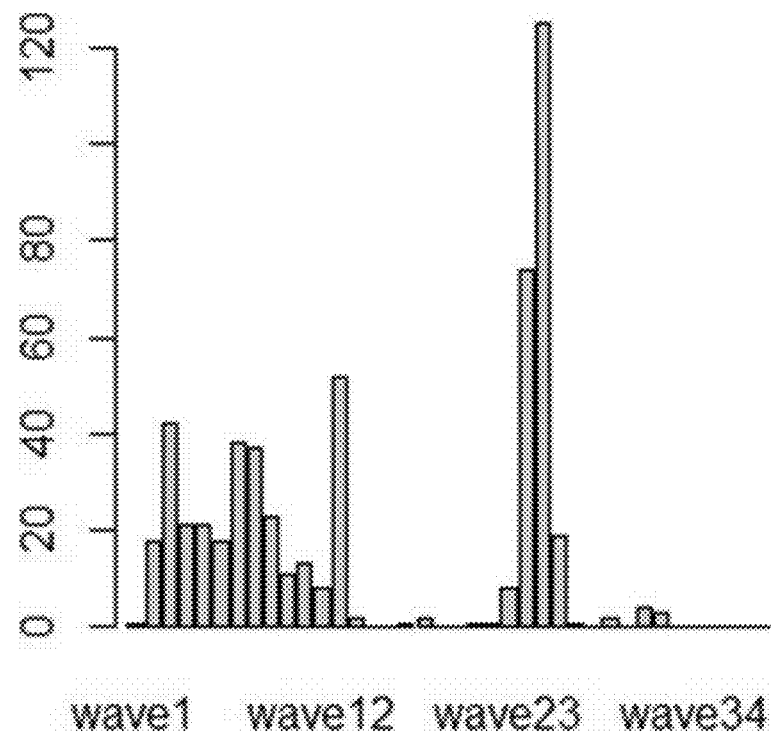
FIG. 17 depicts the spectrum discretized into 100 cm$^{-1}$ bandwidth segments.
Figure 18:
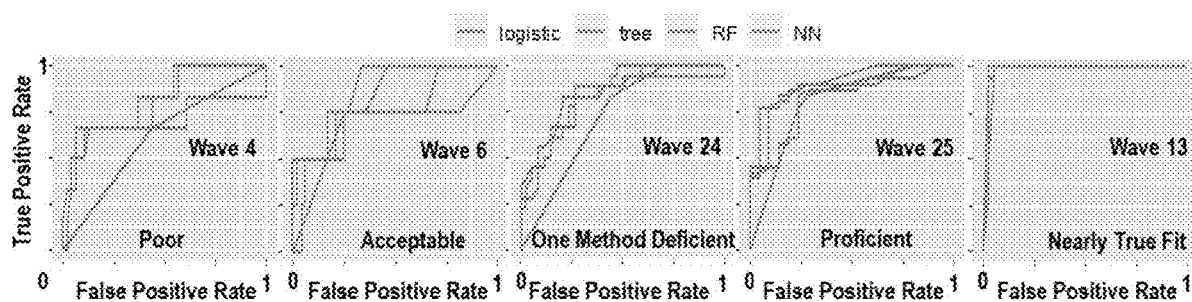
FIG. 18 depicts the receiver operating characteristic (ROC) curves.

To apply one or more machine learning techniques to the spectrum, the spectrum was discretized into 100 cm$^{-1}$ bandwidth segments shown in FIG. 17. The "peak" in each discretization is a response in statistical classification. Receiver operating characteristic (ROC) curves depicted in FIG. 18 were developed and are the integration of prediction probability. The ROC curves consider false positives, false negatives, and correct segments. An ideal ROC curve has an integrand of 1.

Figure 19:
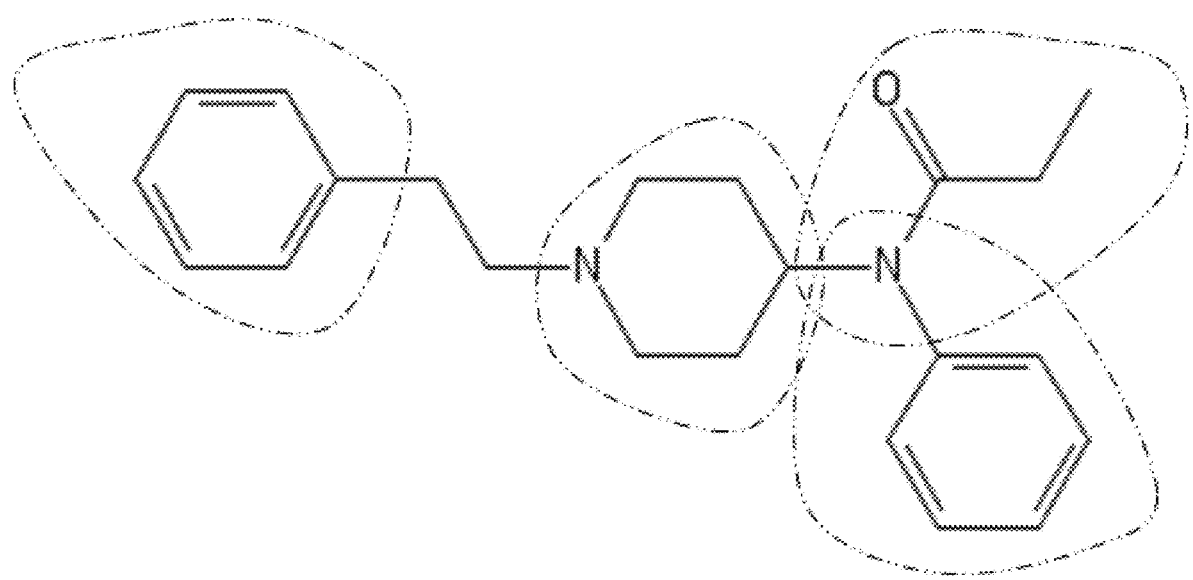
FIG. 19 depicts the chemical structure of fentanyl and its various constituent R-groups.
Figure 20:
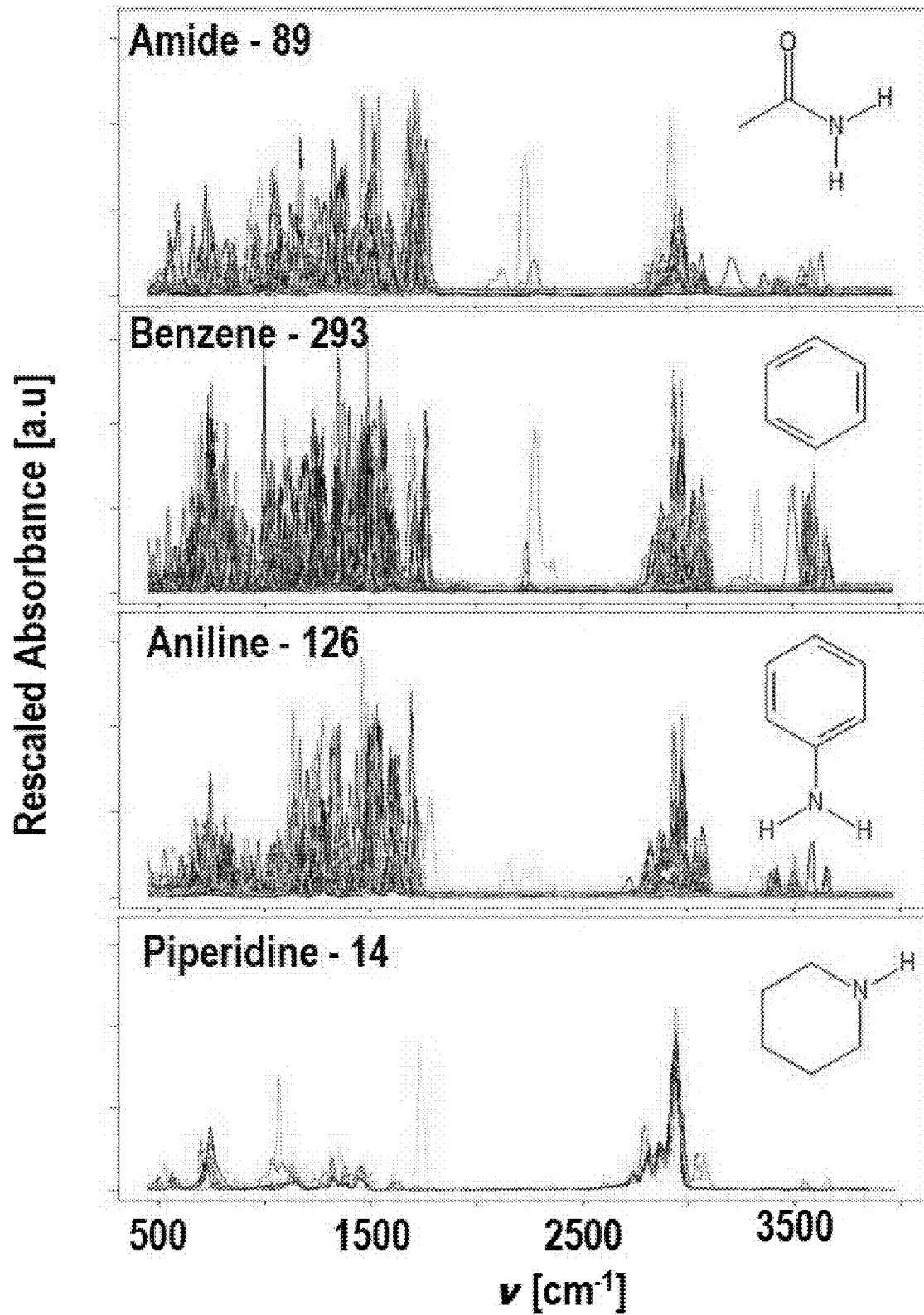
FIG. 20 depicts the absorbance spectra of the various R-groups of fentanyl, as illustrated in FIG. 19.
Figure 21:
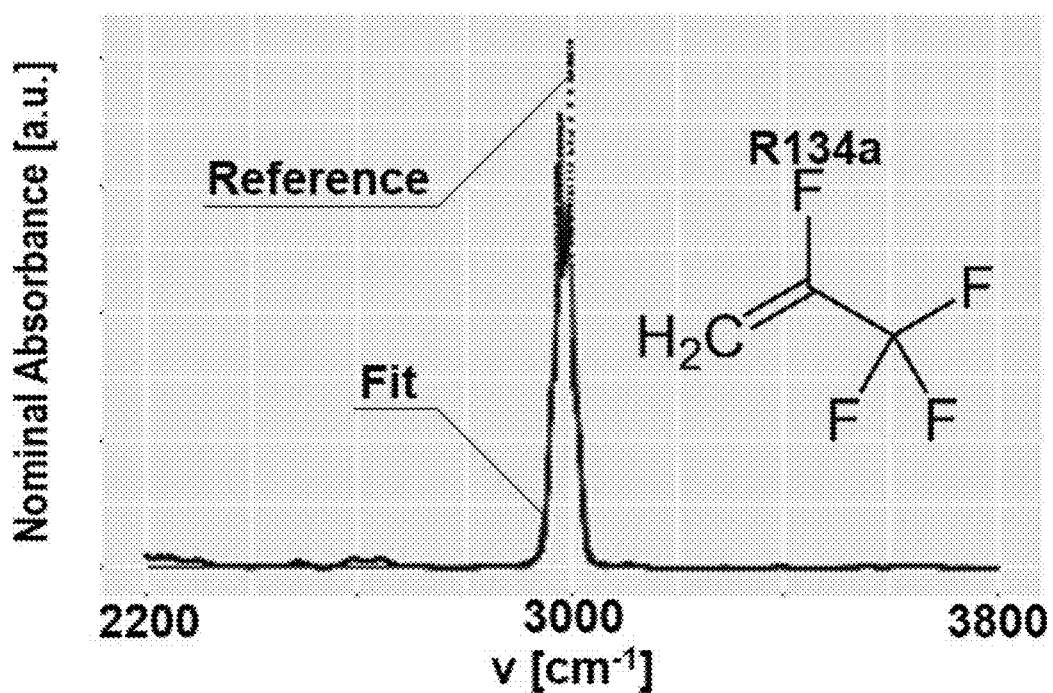
FIG. 21 depicts analyzing spectra using single peak detection.
Figure 22:
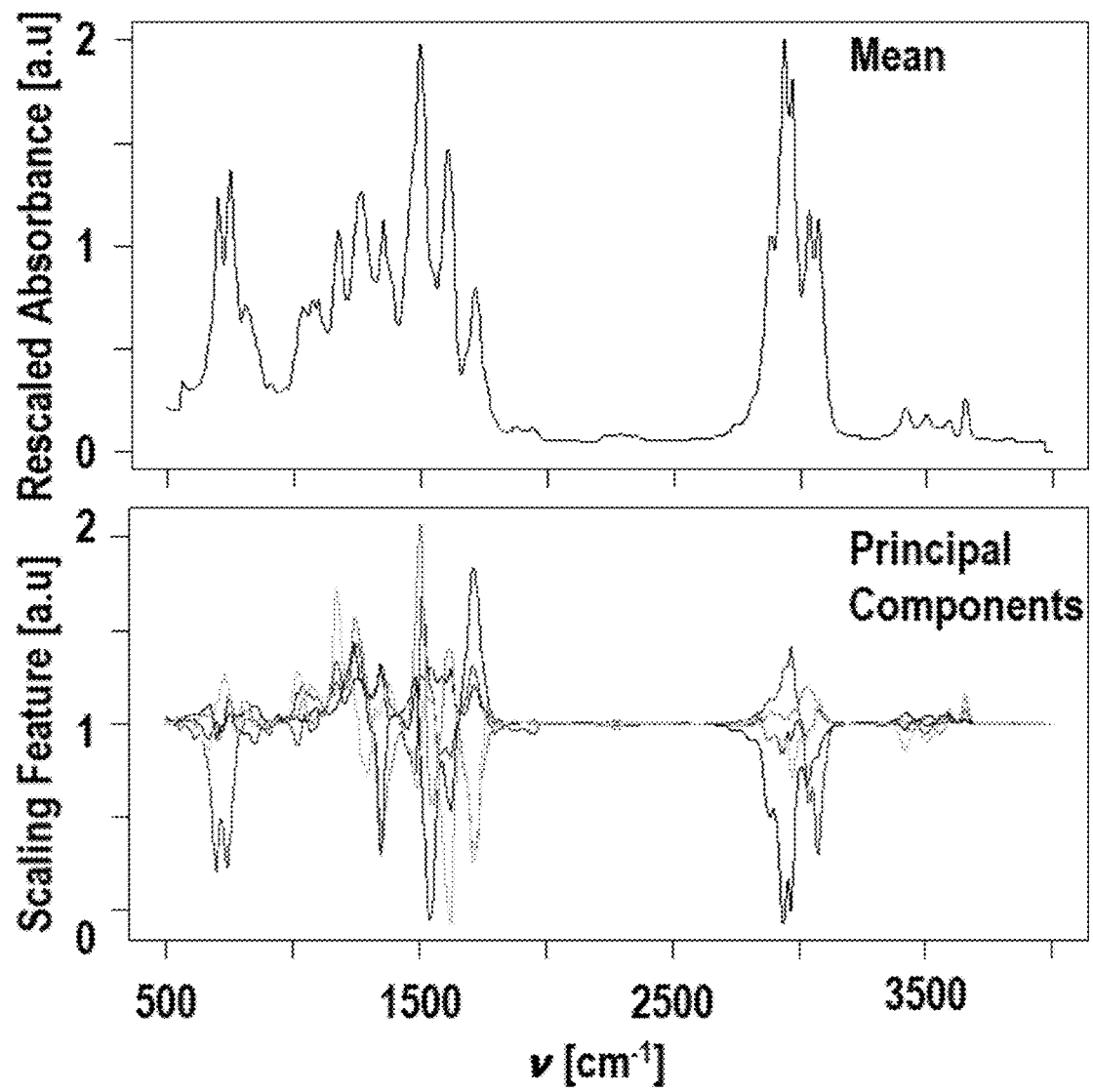
FIG. 22 depicts the process of analyzing and predicting an unknown compound based on its absorbance spectrum.

A total of 558 compounds with IR spectral absorbance data was acquired from the National Institute of Standards and Technology (NIST). Each of the compounds was derived from the fentanyl structure in FIG. 19 and have at least one of the named functional groups depicted in FIG. 20. Based on immediate observation, there were "clumps" on the absorbance peak. These "clumps" were then used to differentiate between the key components of fentanyl. Detection of peaks can be determined based on single peak analysis as shown in FIG. 21. Machine learning depicted in FIG. 22 can then analyze and predict an unknown compound based on its absorbance spectrum based on the fentanyl database. This permits the reference of an unknown compound detected by the portable handheld unit to a known compound stored in the database. In particular, this machine learning technology can be integrated into the handheld unit to permit a user the ability to quickly and accurately determine what an unknown substance is with minimal training.

Figure 23:
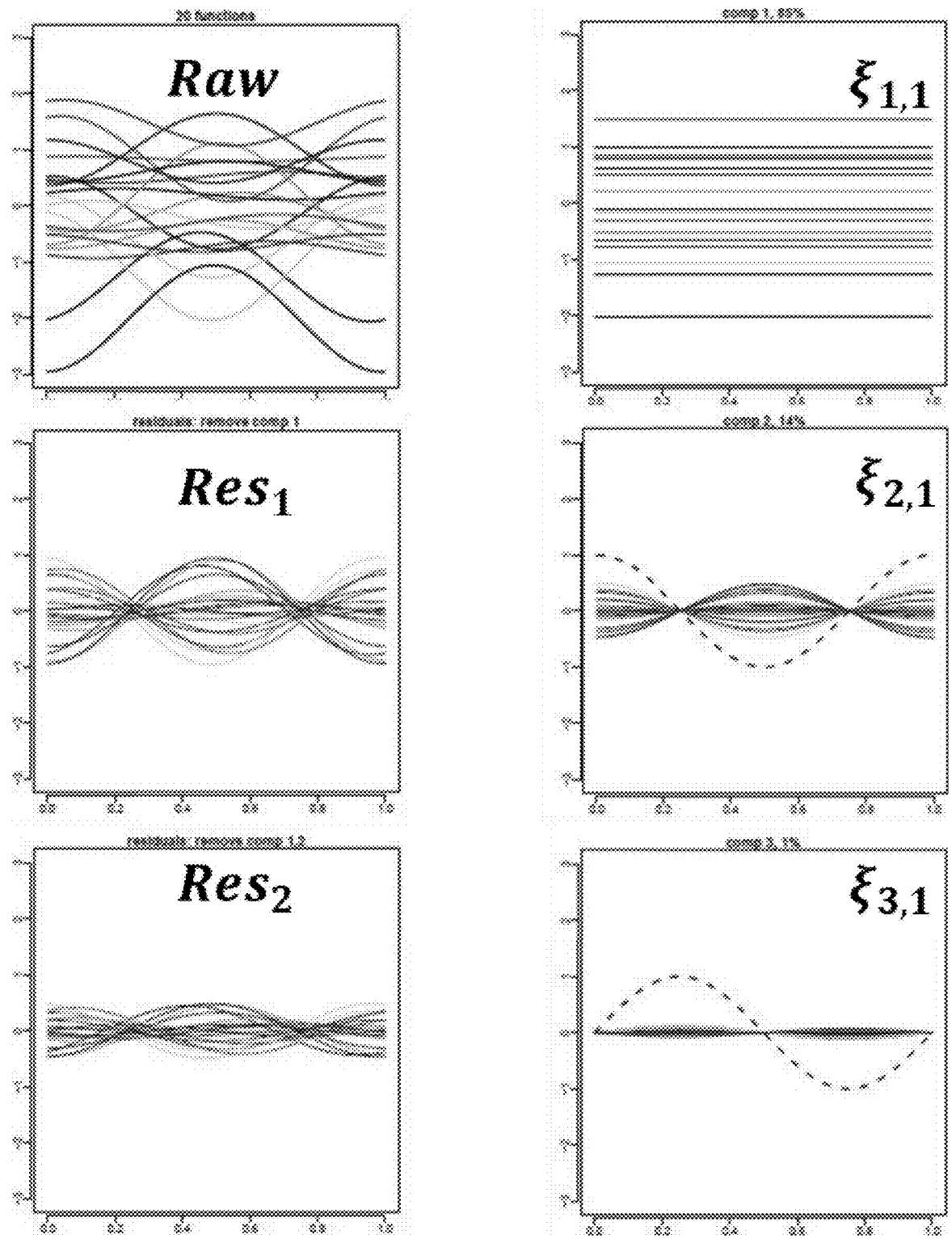
FIG. 23 depicts a functional principal component analysis (PCA).

The functional principal component analysis (PCA) of FIG. 23 was observed for the $i_{th}$ compound at wavenumber $v_j$, in Equation (9).

$$X_i(v) = \underbrace{\mu(v_j)}_{\text{Spline Mean}} + \sum_{k=1}^{K} \underbrace{\xi_{ik}^{\text{Basis Spline Function}} \phi_k(v_{ij})}_{} + \underbrace{\epsilon_{ij}}_{\text{Error}} \quad (9)$$

$\phi_j(v)$, describes the variability in the observed data in Equation 10.

$$\xi_{j,i} = \langle X_i, \phi_j \rangle = \int_v \phi_j(v) X_i(v) dv \quad (10)$$

The principal components (PCs) satisfy that $\phi_i(t)$ has $|\phi_1|^2=1$ and $\phi_i \cdot \phi_{-i}=0$.

Figure 24:
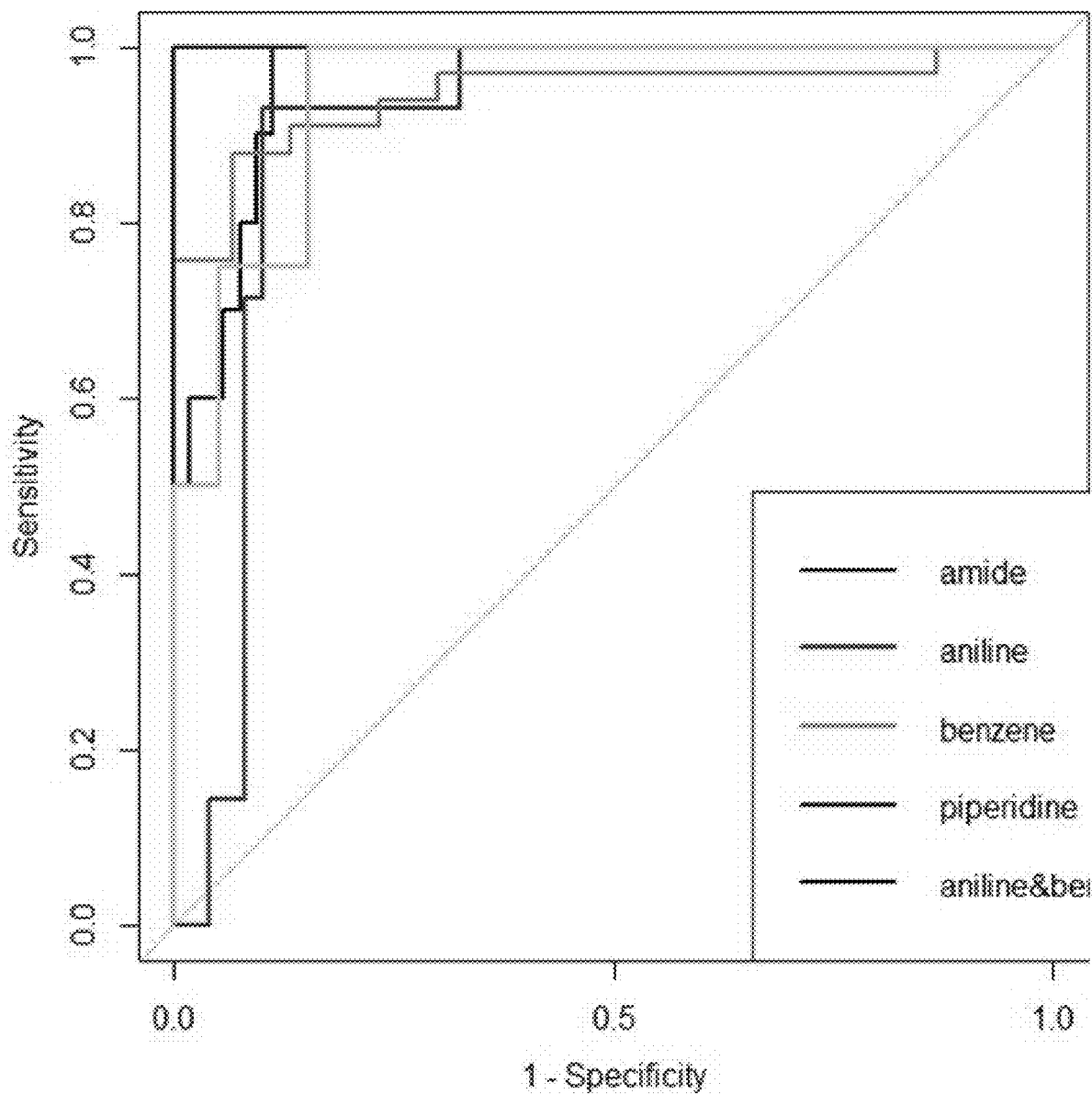
FIG. 24 is a ROC curve analysis illustrating the sensitivity and specificity of the chip detector based on specific functional R-groups.

Overall, the ROC curves show high confidence in accurate prediction. As described in FIG. 24 and FIG. 25, these accurate predictions confirm the successful implementation of using THz and machine learning to identify a specific functional group in an unknown compound from spectra.

While the exemplary embodiment describes the use of the pyroelectric detector employing the novel pyroelectric detection device of the present invention to identify fentanyl and its derivatives, this is not intended to be limiting and it is within the scope of the present invention to utilize the pyroelectric detector in various other situations where terahertz range electromagnetic radiation detection is effective in the identification of a target of interest.

In particular, the pyroelectric detector may be used in terahertz molecular imaging, wherein the detector may be used to identify microbes or other biological items in liquids such as water or solvents. The detector may be used to identify components in pigments, inks, or other marking compounds. The detector may be used to identify debris and foreign objects and their trajectories thereof in or near space. The detector may be used to identify microbial growth on food or transport containers. The detector may be used to identify forensic information, such as bodily fluids, fibers, etc.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. A pyroelectric detection device comprising:
a pyroelectric element comprising a first surface and an opposite second surface;
a first conductive layer adjacent to the first surface of the pyroelectric element, the first conductive layer comprising a periodic array of plasmonic absorbers to transfer energy of terahertz (THz) frequency range electromagnetic radiation incident on the first conductive layer into heating of the pyroelectric element, wherein each of the plasmonic absorbers of the periodic array of plasmonic absorbers comprises;
a cross-shaped inset of the first conductive layer; and
a cross-shaped aperture in the first conductive layer dimensioned to surround the cross-shaped inset; and
a second conductive layer adjacent to the second surface of the pyroelectric element.

2. The pyroelectric detection device of claim 1, wherein the plasmonic absorbers of the periodic array simultaneously provide capacitive and inductive coupling of the electromagnetic radiation.

3. The pyroelectric detection device of claim 1, wherein
the cross-shaped inset of the first conductive layer has a first width (t1);
the cross-shaped aperture in the first conductive layer dimensioned to surround the cross-shaped inset, the cross-shaped aperture has a second width (t) that is greater than the first width (t1) of the cross-shaped inset; and
wherein each of the plasmonic absorbers are separated by the second width (t) and a total width (W1) of each of the plasmonic absorbers is equal to the first width (t1) plus twice the second width (t).

4. The pyroelectric detection device of claim 3, wherein the total width (W1) of each of the plasmonic absorbers determines a primary frequency of the pyroelectric device and wherein the first width (t1) and the second width (t) determine the peak magnitude of the pyroelectric device.

5. The pyroelectric detection device of claim 1, wherein the periodic array of plasmonic absorbers has a periodicity greater than about 20 µm.

6. The pyroelectric detection device of claim 1, wherein the pyroelectric element comprises one or more of, $LiTaO_3$, $BaTiO_3$, $LiNbO_3$, $SrNb_{1-x}Ba_xNb_2O_6$, where $0.2<x<0.7$, $Pb_xMe_yMe'_zO_3$, where $x+y+z=2$, Me is selected from a divalent ion and Me' is selected from a pentavalent ion, and $Hf_xMe_{(1-x)}O_2$, where Me is selected from a combination of Zr, Ti, Pb, Ba, Si, or Al and triglycine sulfate.

7. The pyroelectric detection device of claim 1, wherein the pyroelectric element comprises a z-cut lithium tantalate ($LiTaO_3$) wafer.

8. The pyroelectric detection device of claim 1, wherein the pyroelectric element comprises an z-cut lithium tantalate ($LiTaO_3$) wafer having a thickness of about 50 µm.

9. The pyroelectric detection device of claim 1, wherein the first conductive layer comprises a chromium and gold (Cr/Au) film having a thickness of about 15 nm.

10. The pyroelectric detection device of claim 1, wherein the second conductive layer comprises a chromium and gold (Cr/Au) film having a thickness of about 20 nm.

11. The pyroelectric detection device of claim 1, wherein the pyroelectric element comprises an aluminum nitride (AlN) film.

12. The pyroelectric detection device of claim 1, further comprising measurement circuitry coupled to the first conductive layer and to the second conductive layer, the measurement circuitry to measure an electrical signal generated in the pyroelectric element in response to the heating of the pyroelectric element.

13. A method for detecting terahertz (THz) frequency range electromagnetic radiation, the method comprising:
    positioning a pyroelectric detection device to receive THz frequency range electromagnetic radiation, the pyroelectric detection device comprising a pyroelectric element comprising a first surface and an opposite second surface, a first conductive layer comprising a periodic array of plasmonic absorbers adjacent to the first surface of the pyroelectric element and a second conductive layer adjacent to the second surface of the pyroelectric element, wherein each of the plasmonic absorbers of the periodic array of plasmonic absorbers comprises a cross-shaped inset of the first conductive layer and a cross-shaped aperture in the first conductive layer dimensioned to surround the cross-shaped inset;
    absorbing energy of the THz frequency range electromagnetic radiation by the periodic array of plasmonic absorbers;
    transferring the energy absorbed by the periodic array of plasmonic absorbers to heat the pyroelectric element; and
    measuring an electrical generated in the pyroelectric element in response to the heating of the pyroelectric element.

14. The method of claim 13, wherein the plasmonic absorbers of the periodic array simultaneously provide capacitive and inductive coupling of the electromagnetic radiation.

15. The method of claim 13, wherein the periodic array of plasmonic absorbers has a periodicity greater than about 20 µm.

16. A non-contact terahertz (THz) reflectance spectroscope for identifying a compound of interest, the spectroscope comprising:
    a light source to emit far-infrared wavelength electromagnetic radiation focused on a target of interest;
    a camera focused on the target of interest;
    one or more pyroelectric detection devices to receive electromagnetic radiation reflected from the target of interest, each of the one or more pyroelectric detection devices comprising:
        a pyroelectric element comprising a first surface and an opposite second surface;
        a first conductive layer adjacent to the first surface of the pyroelectric element, the first conductive layer comprising a periodic array of plasmonic absorbers to transfer energy of terahertz (THz) frequency range from the electromagnetic radiation incident on the first conductive layer into heating of the pyroelectric element;
        a second conductive layer adjacent to the second surface of the pyroelectric element;
    measurement circuitry coupled to the first conductive layer and to the second conductive layer, the measurement circuit to measure an electrical signal resulting from the heating of the pyroelectric element to generate reflectance spectra; and
    analysis circuitry to compare the reflectance spectra to known spectra to identify a compound of interest present in the target of interest.

17. The spectroscope of claim 16, wherein the plasmonic absorbers of the periodic array simultaneously provide capacitive and inductive coupling of the electromagnetic radiation.

18. The spectroscope of claim 16, wherein each of the plasmonic absorbers of the periodic array of plasmonic absorbers comprises:
    a cross-shaped inset of the first conductive layer; and
    a cross-shaped aperture in the first conductive layer dimensioned to surround the cross-shaped inset.

* * * * *